United States Patent
Cheng et al.

(10) Patent No.: US 9,395,489 B2
(45) Date of Patent: Jul. 19, 2016

(54) COMPLEMENTARY METAL OXIDE SEMICONDUCTOR DEVICE WITH III-V OPTICAL INTERCONNECT HAVING III-V EPITAXIALLY FORMED MATERIAL

(71) Applicant: INTERNATIONAL BUSINESS MACHINES CORPORATION, Armonk, NY (US)

(72) Inventors: Cheng-Wei Cheng, White Plains, NY (US); Ning Li, White Plains, NY (US); Devendra K. Sadana, Pleasantville, NY (US); Kuen-Ting Shiu, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 34 days.

(21) Appl. No.: 14/509,506

(22) Filed: Oct. 8, 2014

(65) Prior Publication Data

US 2016/0103278 A1    Apr. 14, 2016

(51) Int. Cl.
*H01L 29/06*    (2006.01)
*H01L 29/12*    (2006.01)
(Continued)

(52) U.S. Cl.
CPC .......... *G02B 6/12004* (2013.01); *G02B 6/1228* (2013.01); *H01L 31/0296* (2013.01); *H01L 31/1852* (2013.01); *H01S 5/021* (2013.01); *H01S 5/343* (2013.01)

(58) Field of Classification Search
None
See application file for complete search history.

(56) References Cited

U.S. PATENT DOCUMENTS

| | | |
|---|---|---|
| 4,989,934 A | 2/1991 | Zavracky et al. |
| 5,815,520 A | 9/1998 | Furushima |

(Continued)

FOREIGN PATENT DOCUMENTS

| | | |
|---|---|---|
| CN | 102487046 A | 6/2012 |
| DE | 19941875 C2 | 3/2002 |

(Continued)

OTHER PUBLICATIONS

Li, J. et al., "Monolithic Integration of GaAs/InGaAs Lasers on Virtual Ge Substrates via Aspect-Ratio Trapping," Journal of the Electrochemical Society, May 13, 2009, vol. 156, Issue 5. (pp. H574-H578).

(Continued)

*Primary Examiner* — Sonya D McCall Shepard
(74) *Attorney, Agent, or Firm* — Tutunjian & Bitetto, P.C.; Louis J. Percello

(57) ABSTRACT

An electrical device that in one embodiment includes a first semiconductor device positioned on a first portion of a type IV semiconductor substrate, and an optoelectronic light emission device of type III-V semiconductor materials that is in electrical communication with the first semiconductor device. The optoelectronic light emission device is positioned adjacent to the first semiconductor device on the first portion of the type IV semiconductor substrate. A dielectric waveguide is present on a second portion of the type IV semiconductor substrate. An optoelectronic light detection device of type III-V semiconductor material is present on a third portion of the type IV semiconductor device. The dielectric waveguide is positioned between and aligned with the optoelectronic tight detection device and optoelectronic light emission device to transmit a light signal from the optoelectronic light emission device to the optoelectronic light detection device.

20 Claims, 8 Drawing Sheets

(51) Int. Cl.
  *G02B 6/12* (2006.01)
  *H01S 5/343* (2006.01)
  *H01S 5/02* (2006.01)
  *H01L 31/0296* (2006.01)
  *H01L 31/18* (2006.01)
  *G02B 6/122* (2006.01)

(56) References Cited

U.S. PATENT DOCUMENTS

| | | |
|---|---|---|
| 6,326,645 B1 | 12/2001 | Kadota |
| 6,493,497 B1 | 12/2002 | Ramdani et al. |
| 6,759,688 B2 | 7/2004 | Preston et al. |
| 7,251,389 B2 | 7/2007 | Lu et al. |
| 8,110,823 B2 | 2/2012 | Bowers |
| 8,183,134 B2 | 5/2012 | Wu et al. |
| 8,290,014 B2 | 10/2012 | Junesand et al. |
| 8,299,351 B2 | 10/2012 | Hsu |
| 8,421,055 B2 | 4/2013 | Kunert et al. |
| 8,525,201 B2 | 9/2013 | Lee et al. |
| 8,530,342 B2 | 9/2013 | Pan |
| 2004/0232430 A1 | 11/2004 | Lempkowski et al. |
| 2005/0025909 A1 | 2/2005 | Jurgensen et al. |
| 2007/0170417 A1 | 7/2007 | Bowers |
| 2008/0149936 A1 | 6/2008 | Joblot et al. |
| 2010/0044719 A1 | 2/2010 | Yu et al. |
| 2010/0078680 A1 | 4/2010 | Cheng et al. |
| 2012/0019902 A1 | 1/2012 | Williams et al. |
| 2013/0022072 A1 | 1/2013 | Bowers |
| 2013/0112939 A1 | 5/2013 | Chen et al. |
| 2013/0140525 A1 | 6/2013 | Chen et al. |

FOREIGN PATENT DOCUMENTS

| | | |
|---|---|---|
| JP | 01120012 A | 5/1989 |
| JP | 03247597 A | 11/1991 |
| JP | 08195356 A | 7/1996 |
| WO | 2009110806 A1 | 9/2009 |

OTHER PUBLICATIONS

Roelkens, G., et al., "III-V/silicon Photonics for On-Chip and Intra-Chip Optical Interconnects."

COMPLEMENTARY METAL OXIDE SEMICONDUCTOR DEVICE WITH III-V OPTICAL INTERCONNECT HAVING III-V EPITAXIALLY FORMED MATERIAL

BACKGROUND

1. Technical Field

The present disclosure relates to semiconductor devices, such as optoelectronic devices composed of III-V semiconductor materials.

2. Description of the Related Art

The dimensions of semiconductor field effect transistors (FETs) have been steadily shrinking over the last thirty years or so, as scaling to smaller dimensions leads to continuing device performance improvements. With increasing scaling of semiconductor devices, the interconnects have also been decreasing in size. Typically, as the interconnect size has decreased, the resistance of the interconnects has increased. With increased scaling of semiconductor devices leading to increased switching speeds, the obstruction to further performance enhancements is the speed at which data signals can be transmitted over interconnects.

SUMMARY

In one aspect, an electrical device is provided that includes a first semiconductor device positioned on a first portion of a type IV semiconductor substrate, and an optoelectronic light emission device comprising type III-V semiconductor materials that is in electrical communication with the first semiconductor device. The optoelectronic light emission device is positioned adjacent to the first semiconductor device on the first portion of the type IV semiconductor substrate. A dielectric waveguide is present on a second portion of the type IV semiconductor substrate. An optoelectronic light detection device comprising type III-V semiconductor material is present on a third portion of the type IV semiconductor device. The dielectric waveguide is positioned between and aligned with the optoelectronic light detection device and optoelectronic light emission device to transmit alight signal from the optoelectronic light emission device to the optoelectronic light detection device.

In another embodiment, the electrical device includes a first conductivity semiconductor device positioned on a first portion of a type IV semiconductor substrate, and an optoelectronic light emission device comprising type III-V semiconductor materials that is in electrical communication with the first semiconductor device. The optoelectronic light emission device is positioned adjacent to the first semiconductor device on the first portion of the type IV semiconductor substrate. A dielectric waveguide may be present on a second portion of the type IV semiconductor substrate. An optoelectronic light detection device comprising type III-V semiconductor material can be present on a third portion of the type IV semiconductor substrate. The dielectric waveguide is positioned between and aligned with the optoelectronic light detection device and optoelectronic light emission device to transmit a light signal from the optoelectronic light emission device to the optoelectronic light detection device. A second conductivity semiconductor device may also be positioned on the third portion of the type IV semiconductor substrate. The second conductivity semiconductor device is in electrical communication with the optoelectronic light detection device.

In another aspect, a method of forming an electrical device is provided that includes forming a first semiconductor device on a first portion of an SOI substrate and forming a second semiconductor device on a third portion of the SOI substrate. The SOI substrate typically includes an SOI layer present on a buried dielectric layer, the buried dielectric layer being present on a base semiconductor layer. The method may include the step of removing a portion of the SOI layer and the buried dielectric layer of the SOI substrate to expose regions of the base semiconductor layer adjacent to each of the first semiconductor device and the second semiconductor device. An island of remaining portions of at least the buried dielectric layer is present between the exposed regions of the base semiconductor layer in a second portion of the SOI substrate. An optoelectronic light emission device comprising type III-V semiconductor materials may be formed on the exposed portion of the base semiconductor layer adjacent to the first semiconductor device. An optoelectronic light detection device comprising type III-V semiconductor material may be formed on the exposed portion of the base semiconductor layer adjacent to the second semiconductor device. A dielectric waveguide may be formed on the island of the remaining portions of the at least the buried dielectric layer.

BRIEF DESCRIPTION OF DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION OF THE PREFERRED EMBODIMENTS

Figure 1:
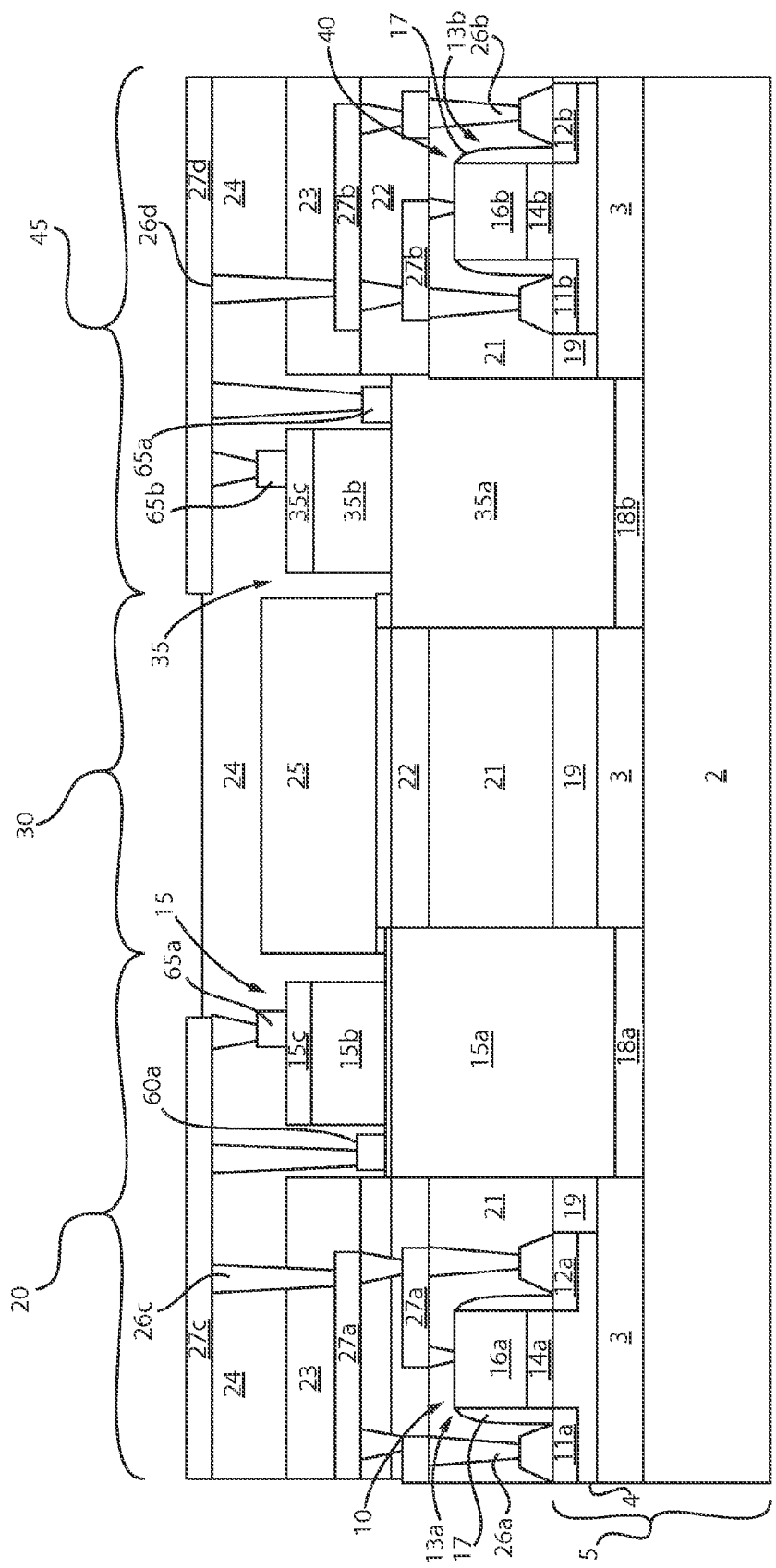
FIG. 1 is a side cross-sectional view depicting one embodiment of an electronic device on a type IV semiconductor substrate including a first semiconductor device and an optoelectronic light emission device of type III-V semiconductor materials positioned on a first portion of the type IV semiconductor substrate, a dielectric waveguide positioned on a second portion of the type IV semiconductor substrate, and an optoelectronic light detection device comprising type III-V semiconductor material present on a third portion of the type IV semiconductor substrate, in accordance with the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "present on", and "over" mean that a first element, such as a first structure, is present on a second element, such as a second structure, wherein intervening elements, such as an interface structure, e.g. interface layer, may be present between the first element and the second element. The terms "direct contact", "directly on" and "contacting" mean that a first element, such as a first structure, and a second element, such as a second structure, are connected without any intermediary conducting, insulating or semiconductor layers at the interface of the two elements.

In some embodiments, the methods and structures disclosed herein provide optoelectronic devices, e.g., an optoelectronic light emission device and an optoelectronic light detection device, which are composed of III-V semiconductor materials, and function as an optical interconnect in the transmission of data from one semiconductor device to another across a type IV semiconductor substrate. It has been determined that data transmission across physical electrical communication structures, such as vias, lines, and bus bars, is slow when compared to data transmission using optical interconnects, i.e., data via transmission of light signals. In some embodiments, the methods and structures disclosed herein replace the bus-bar that typically provides for electrical communication between semiconductor devices in a complementary metal oxide semiconductor (CMOS) arrangement with an optical interconnect to increase the speed of data transmission to and from the semiconductor devices present on the substrate.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. In some embodiments, the semiconductor device may be a field effect transistor (FET). As used herein a "field effect transistor" is a transistor in which output current, i.e., source-drain current, is controlled by the voltage applied to the gate. A field effect transistor has three terminals, i.e., gate, source and drain. It is noted that the field effect transistor is only one type of semiconductor device that is within the scope of the present disclosure, and it is not intended that the semiconductor devices employed in the methods and structures of the present disclosure be limited to only FETs. For example, the semiconductor devices may be any switching device including, but not limited to, fin field effect transistor (FinFET), metal oxide semiconductor field effect transistor (MOSFET), bipolar junction transistor (BJT), Schottky barrier semiconductor device, junction field effect transistor (JFET), and combinations thereof. In other examples, the semiconductor device may be a memory device. As used herein, the term "memory device" means a structure in which the electrical state can be altered and then retained in the altered state, in this way a bit of information can be stored. Examples of memory devices that may be employed in the present disclosure include flash memory, dynamic random access memory and combinations thereof.

In some embodiments, the semiconductor devices may be configured in complementary metal-oxide-semiconductor (CMOS) arrangement. The word "complementary" refer to the fact that the typical digital design style with CMOS uses complementary and symmetrical pairs of p-type and n-type metal oxide semiconductor field effect transistors (MOSFETs) for logic functions. CMOS technology is used in microprocessors, microcontrollers, static RAM, and other digital logic circuits. CMOS technology is also used for several analog circuits such as image sensors (CMOS sensor), data converters, and highly integrated transceivers for many types of communication.

As used herein, the term "optoelectronic light emission device" denotes a semiconductor light emitting structure, such as a laser diode. The laser diode is an electrically pumped semiconductor laser in which the active medium is formed by a p-n junction of a semiconductor diode similar to that found in a light-emitting diode. A laser diode is electrically a p-i-n diode. The active region of the laser diode is in the intrinsic (I) region, and the carriers, electrons and holes, are pumped into it from the N and P regions (n-type doped regions or p-type doped regions) respectively, also referred to herein as the first III-V semiconductor material layer and second III-V semiconductor material layer.

In some embodiments, the optoelectronic light emission device may be a quantum well laser. A quantum well laser is a laser diode in which the active region of the device is so narrow that quantum confinement occurs. If the middle layer, i.e., active region, of the laser is made thin enough, it acts as a quantum well. This means that the vertical variation of the electron's wavefunction, and thus a component of its energy, is quantized. The term "quantum well" or "QW" used herein refers to a thin-layer structure comprising alternate layers consisting of a first semiconductor layer with a thickness smaller than the de Broglie wavelength of about 200 Å to 300 Å with respect to electrons or holes, and at least a second semiconductor layer with a band gap greater than that of the first semiconductor layer. The term "band gap" refers to the energy difference between the top of the valance band (i.e., Ev) and the bottom of the conduction band (i.e., Ec). A QW structure can be formed by sandwiching a semiconductor thin layer of a narrow band gap between semiconductor layers of a large band gap. Lasers containing more than one quantum well layer are known as multiple quantum well lasers.

If a single semiconductor thin layer constitutes a quantum well for both electrons and holes, the quantum well is called a type I quantum well. In this case, the semiconductor layer of a narrow band gap is called a well layer, and the semiconductor layers of a large band gap are called barrier layers. A type I multi-quantum well structure can be formed by alternately laminating semiconductor layers of narrow and broad band gaps. A type II quantum well structure has a first semiconductor layer forming a quantum well for electrons, a second semiconductor layer forming a quantum well for holes formed on the first semiconductor layer and third semiconductor layers sandwiching the first and second semiconductor layers as barrier layers to the electrons and holes. A type II multi-quantum well structure can be formed by alternately laminating first semiconductor layers, second semiconductor layers and third semiconductor layers. Optoelectronic light emission devices including both type I and type II quantum wells are within the scope of the present disclosure.

The term "waveguide" as used herein, denotes a structure that receives light signals from a first optoelectronic device, e.g., optoelectronic light emission device, and directs the light signal to a second optoelectronic device, e.g., optoelectronic light detection device. Examples of materials that are suitable for the dielectric waveguide include, without limitation, silicon oxides (e.g., doped or undoped silicon dioxide, $SiO_2$), silicon nitride, silicon oxynitride, silicon carbide, hafnium oxide, aluminum oxide, and silica.

The term "optoelectronic light detection device" as used herein, denotes a semiconductor containing photodetector. For example, the optoelectronic light detection device may be composed of an III-V semiconductor material, such as GaInAs, and may function as an infrared detector. Detection of a light signal may include conversion of the light signal into an electrical signal. GaInAs photodiodes are example of an optoelectronic light detection device in accordance with the present disclosure that may be used to detect wavelengths ranging from 1.1 µm to 1.7 µm. In other embodiments, the photodetector may be composed of III-V semiconductor materials that can be employed for detection of telecom wavelengths, i.e., wavelengths ranging from 1.31 µm to 1.55 µm. In some embodiments, the optoelectronic light detection device can be a III-V pin photodetector. For example, the III-V pin photodetector may include a p-type conductivity semiconductor layer, e.g., p-InGaAs layer, at least one intrinsic semiconductor layer, e.g., i-InGaAs layer, and an n-type conductivity semiconductor layer, e.g., n-InGaAs layer. In one example, the III-V pin photodetector may be provided by an i-InGaAs layer serving as the intrinsic absorption layer that is sandwiched between an n-InP layer and a p-InGaAs layer. The n-type and p-type conductivity layers that are on opposing sides of the intrinsic absorption layer in a III-V pin photodetector may be referred to as cladding layers.

Further details regarding the above described optoelectronic devices, e.g., optoelectronic light emission device and optoelectronic light detection device, semiconductor devices and waveguides are now described with reference to FIGS. 1-8.

FIG. 1 depicts one embodiment of an electrical device that includes a type IV semiconductor substrate 5. The term "type IV" as used to describe a semiconductor material means that the semiconductor material is in Group IV of the Periodic Table of Elements (Group 14 in accordance with the IUPAC system). As will be described below, the type IV semiconductor substrate 5 is typically composed of a silicon containing material, but the present disclosure is not limited to only this example, as germanium containing substrates and silicon carbide containing substrates are also within the scope of the present disclosure. Any substrate material that meets the definition of a type IV semiconductor substrate is within the scope of the present disclosure.

In some embodiments, the type IV semiconductor substrate 5 is a semiconductor on insulator (SOI) substrate (hereafter referred to as semiconductor on insulator (SOI) substrate 5). In one embodiment, the SOI substrate 5 typically includes a semiconductor on insulator (SOI) layer 4 that is present on a buried dielectric layer 3, wherein the buried dielectric layer 3 is present on a base semiconductor substrate 2. The SOI layer 4 of the SOI substrate 5 may be composed of any type IV semiconductor material, such as silicon, monocrystalline silicon, polycrystalline silicon, silicon germanium, monocrystalline silicon germanium, polycrystalline silicon germanium, silicon doped with carbon (Si:C), silicon carbide, silicon germanium doped with carbon (SiGe:C) and combinations thereof. In other embodiments, the SOI layer 4 may be composed of a type III-V semiconductor material, such as, GaAs, InAs, InP as well as other III/V and II/VI compound semiconductors. The SOI layer 4 may have a thickness ranging from 10 nm to 250 nm. In some embodiments, in which the SOI layer 4 is an extremely thin SOI layer (ETSOI layer), the thickness of the SOI layer 4 may be less than 10 nm.

The buried dielectric layer 3 may be composed of any oxide, nitride or oxynitride dielectric material. For example, when the buried dielectric layer 3 is an oxide, the buried dielectric layer 3 may be composed of silicon oxide. In another example, when the buried dielectric layer 3 is a nitride, the buried dielectric layer 3 may be silicon nitride. The thickness of the buried dielectric layer 3 may range from 10 nm to 250 nm. The base semiconductor substrate 2 may be composed of any type IV semiconductor material including, but not limited to Si, strained Si, SiC, SiGe, SiGeC, Si alloys, Ge, Ge alloys and combinations thereof. In other embodiments, the base semiconductor substrate 2 may be composed of a type III-V semiconductor material, such as, GaAs, InAs, InP as well as other III/V and II/VI compound semiconductors. The base semiconductor layer 2 may have the same or a different composition than the SOI layer 4.

A first portion 20 of the SOI substrate 5 contains a first semiconductor device 10 and an optoelectronic light emission device 15. A second portion 30 of the SOI substrate 5 contains a dielectric waveguide 25. A third portion 45 of the SOI substrate 5 contains an optoelectronic light detection device 35 and a second semiconductor device 40.

The first and second semiconductor devices 10, 40 may be any switching or memory type device, as described above. In the embodiment that is depicted in FIG. 1, the first and second semiconductor devices 10, 40 each include a source region 11a, 11b, and a drain region 12a, 12b on opposing sides of a gate structure 13a, 13b. In some embodiments, the source and drain regions 11a, 11b, 12a, 12b are formed, i.e., present, within a remaining portion of the SOI layer 4 in each of the first and third portions 20, 45 of the SOI substrate 5. As used herein, the term "source" is a doped region in the semiconductor device, in which majority carriers are flowing into the channel. As used herein, the term "channel" is the region underlying the gate structure and between the source and drain of a semiconductor device that becomes conductive when the semiconductor device is turned on. As used herein, the term "drain" means a doped region in semiconductor device located at the end of the channel, in which carriers are flowing out of the transistor through the drain. A "gate structure" means a structure used to control output current (i.e., flow of carriers in the channel) of a semiconducting device through electrical or magnetic fields. The gate structures 13a, 13b typically include at least one gate dielectric 14a, 14b that is present on the channel region portion of the semiconductor device, and at least one gate conductor 16a, 16b.

The conductivity type of the source and drain regions 11a, 11b, 12a, 12b typically dictates the conductivity type of the semiconductor device 10, 40 to which the source and drain regions 11a, 11b, 12a, 12b correspond. The term "conductivity type" denotes whether a semiconductor material has been doped to an n-type or p-type conductivity. As used herein, "p-type" refers to the addition of impurities to an intrinsic semiconductor that creates deficiencies of valence electrons. In a type IV semiconductor material, such as the SOI layer 4 of the SOI substrate 5, examples of n-type dopants, i.e., impurities, include but are not limited to: boron, aluminum, gallium and indium. As used herein, "n-type" refers to the addition of impurities that contributes free electrons to an intrinsic semiconductor. In a type IV semiconductor material, such as the SOI layer 4 of the SOI substrate 5, examples of n-type dopants, i.e., impurities, include but are not limited to antimony, arsenic and phosphorous.

In some embodiments, the first semiconductor device 10 may have a source region 11a and a drain region 12a doped to an n-type conductivity, i.e., first conductivity type, to provide an n-type FET, i.e., first conductivity FET, and the second semiconductor device 40 may have a source region 11b and drain region 12b doped to a p-type conductivity, i.e., second conductivity type to provide a p-type FET, i.e., second conductivity FET. In some embodiments, the first semiconductor device 10 may have a source region 11a and a drain region 12a doped to a p-type conductivity, i.e., first conductivity type, to provide a p-type FET, and the second semiconductor device 40 may have a source region 11b and drain region 12b doped to an n-type conductivity, i.e., second conductivity type to provide an n-type FET. In some examples, when the first semiconductor device 10 has a first conductivity type, and the second semiconductor device 40 has a second conductivity type that is different from the first conductivity type, the first and second semiconductor devices 10, 40 may be referred to as being in a CMOS arrangement.

The at least one gate dielectric 14a, 14b for each of the gate structures 13a, 13b for the first semiconductor device 10 and the second semiconductor device 40 can be comprised of a semiconductor oxide, semiconductor nitride, semiconductor oxynitride, or any multilayered stack thereof. In one example, the at least one gate dielectric 14a, 14b can be comprised of a semiconductor oxide such as, e.g., silicon dioxide. The at least one gate dielectric 14a, 14b can also be comprised of a dielectric metal oxide having a dielectric constant that is greater than the dielectric constant of silicon dioxide, e.g., 3.9. The dielectric constants that are described herein are measured at room temperature, i.e., 25° C., at atmospheric pressure, i.e., 1 atm. In one embodiment, the at least one gate dielectric 14a, 14b can comprise a dielectric oxide having a dielectric constant greater than 4.0. In another embodiment, the at least one gate dielectric 14a, 14b can be comprised of a dielectric oxide having a dielectric constant of greater than 8.0. Exemplary dielectric oxide materials which have a dielectric constant of greater than 3.9 include, but are not limited to $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. In some embodiments, multilayered stacks of at least two of the above mentioned dielectric materials can be employed as the at least one gate dielectric layer 14a, 14b. For example, the at least one gate dielectric 14a, 14b can include a stack of, from bottom to top, silicon dioxide and hafnium oxide.

The at least one gate conductor 16a, 16b may be composed of conductive materials including, but not limited to metals, metal alloys, metal nitrides and metal silicides, as well as laminates thereof and composites thereof. In one embodiment, the at least one gate conductor 16a, 16b may be any conductive metal including, but not limited to W, Ni, Ti, Mo, Ta, Cu, Pt, Ag, Au, Ru, Ir, Rh, and Re, and alloys that include at least one of the aforementioned conductive elemental metals. The at least one gate conductor 16a, 16b may also comprise doped polysilicon and/or polysilicon-germanium alloy materials (i.e., having a dopant concentration from $1 \times 10^{18}$ dopant atoms per cubic centimeter to $1 \times 10^{22}$ dopant atoms per cubic centimeter) and polycide materials (doped polysilicon/metal silicide stack materials).

A gate sidewall spacer 17 may be present on the sidewall of the gate structures 13a, 13b. The gate sidewall spacer 17 may be composed of an oxide, nitride, or oxynitride material.

Referring to FIG. 1, in some embodiments, the first semiconductor device 10 may be present on a first region of the first portion 20 of the SOI substrate 5, while the optoelectronic light emission device 15 is present on a second region of the first portion 20 of the SOI substrate 5. At least a portion of the optoelectronic light emission device 15 is formed within the same level of the electronic device as the first semiconductor device 10. For example, the first conductivity type III-V semiconductor material layer 15a of the optoelectronic light emission device 15 may have a lower surface that is approximately coplanar with a lower surface, i.e., bottom surface of the SOI layer 4, of the first semiconductor device 10. In the embodiment depicted in FIG. 1, the upper surface of the optoelectronic light emission device 15, i.e., the second conductivity type III-V semiconductor material layer 15c, may extend above the upper surface of the first semiconductor device 10. As will be described in greater detail below, the portion of the SOI layer 4 and the buried dielectric layer that is present in the second region of the first portion 20 of the SOI substrate 5 is removed before the optoelectronic light emission device 15 is formed.

In some embodiments, the optoelectronic light emission device 15 is formed directly on a buffer layer 18a (hereafter referred to as first buffer layer), wherein the buffer layer 18a is formed directly on the base semiconductor substrate 2 portion of the SOI substrate 5. The base semiconductor substrate 2 is typically composed of a type IV semiconductor material. The first buffer layer 18a may have a lattice dimension between a lattice dimension for the base semiconductor substrate 2 (also referred to as the base semiconductor layer) and the first conductivity type III-V semiconductor material layer 15a (also referred to the base III-V semiconductor layer) of the optoelectronic light emission device 15, the base semiconductor layer 2 having a composition selected from the group consisting of SiGe, Ge, GaAs, AlGaAs, GaAsP, InGaAs, InP, InGaAsP, and combinations thereof. The first buffer layer 18a may be composed of a semiconductor material that is selected from the group consisting of Ge, GaP, GaAs, InP and combinations thereof. The thickness of the first buffer layer 18a may range from 5 nm to 5,000 nm.

In some embodiments, the optoelectronic light emission device 15 may be a laser diode composed of III-V compound semiconductors. As used herein, the term "III-V compound semiconductor" denotes a semiconductor material that includes at least one element from Group III of the Periodic Table of Elements (Group 13 in accordance with the IUPAC system), and at least one element from Group V of the Periodic Table of Elements (Group 15 in accordance with the IUPAC system).

Examples of III-V compound semiconductor materials that can be employed in the material layers of the optoelectronic light emission device 15 include (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof.

Laser diodes are formed in compound semiconductor materials, such as III-V semiconductor materials, that are able to emit light. In one embodiment, the laser diode that provides the optoelectronic light emission device 15 includes a first conductivity type III-V semiconductor material layer 15a that is present directly on buffer layer 18a, a stacked structure of quantum wells 15b comprising III-V semiconductor material layer that is present on the first conductivity type III-V semiconductor material layer 15a, and a second conductivity type III-V semiconductor material layer 15b that is present on the stacked structure of quantum wells 12.

The optoelectronic light emission device 15 depicted in FIG. 1 is a quantum well laser, in which the wavelength of the light emitted by the quantum well laser is determined by the width of the active region rather than just the bandgap of the material from which it is constructed. The first and second conductivity type III-V semiconductor material layers 15a, 15c, which may also be referred to as cladding layers, typically are doped to a first conductivity type and an opposing second conductivity type. For example, the first conductivity type III-V semiconductor material layer 15a may be doped to a first conductivity, e.g., n-type conductivity, and the second conductivity type III-V semiconductor material layer 15c may be doped to a second conductivity, e.g., p-type conductivity.

In some embodiments, the first and second conductivity type III-V semiconductor material layers 15a, 15c function to pump charge carriers, i.e., electron and hole charge carriers, into the intrinsic active area provided by the quantum well. In some examples, the first conductivity type III-V semiconductor material layer 15a may be composed of InP, GaAs, AlGaAs, InAlAs or a combination thereof. The dopant that provides the conductivity type, i.e., first type conductivity, e.g., n-type, of the first conductivity type III-V semiconductor material layer 15a may be present in a concentration ranging from $10^{17}$ atoms/cm$^3$ to $10^{20}$ atoms/cm$^3$. In some examples, the first conductivity type III-V semiconductor material layer 15a may have a thickness ranging from 100 nm to 2000 nm. In some embodiments, the second conductivity type III-V semiconductor material layer 15b may be composed of InP or GaAs or AlGaAs or InAlAs. The dopant that provides the conductivity type, i.e., second type conductivity, e.g., p-type, of the second conductivity type III-V semiconductor material layer 15b may be present in a concentration ranging from $10^{17}$ atoms/cm$^3$ to $10^{20}$ atoms/cm$^3$. In some examples, the second conductivity type III-V semiconductor material layer 15c may have a thickness ranging from 100 nm to 2000 nm. It is noted that the above compositions and thicknesses are provided for illustrative purposes only, and are not intended to limit the present disclosure. For example, the first and second conductivity type III-V semiconductor material layers 15a, 15c may be composed of any III-V compound semiconductor composition provided above.

The active region of the laser diode is in the intrinsic (I) region. By "intrinsic" it is meant that the region is not doped with an extrinsic dopant, e.g., n-type or p-type dopant, such as the dopants used to dope the first and second conductivity type III-V semiconductor material layers 15a, 15c. The active region in the quantum well structure 15b is formed by alternating layers of relatively low bandgap material and layers of relatively high bandgap material. As used herein, a "low bandgap" is a bandgap ranges from 0.5 eV to 3.0 eV, and a "high bandgap" ranges from 1.0 eV to 3.5 eV. The former layers are termed "well layers" and the latter layers are termed "barrier layers." For example, the active low bandgap layers comprised $Al_rGa_{1-r}As$ and the passive high bandgap layers comprised $Al_zGa_{1-z}As$ with r<z.

To provide the stacked structure of quantum wells 15b, the thickness of each layer of III-V compound semiconductor material within the quantum well 15b may be no greater than 50 nm. For example, the thickness for each layer of the III-V compound semiconductor material within the quantum well 15b may range from 5 nm to 10 nm. In some embodiments, the stacked structure of quantum wells 15b may be composed of 1 to 100 layers of semiconductor material, such as III-V compound semiconductor material. In yet another embodiment, the stacked structure of quantum wells 15b may be composed of 1 to 5 layers of semiconductor material. In some embodiments, the quantum well (QW) layers and barrier layers of the quantum well structure 15b are formed of a semiconductor material, such as $In_xGa_{1-x}As_yP_{1-y}$, $In_xGa_{1-x}As$, $In_xGa_{1-x}N_yAs_{1-y}$, $In_xGa_{1-x}As_ySb$ (here, 0.0<x<1.0, 0.0<y<1.0).

Figure 2:
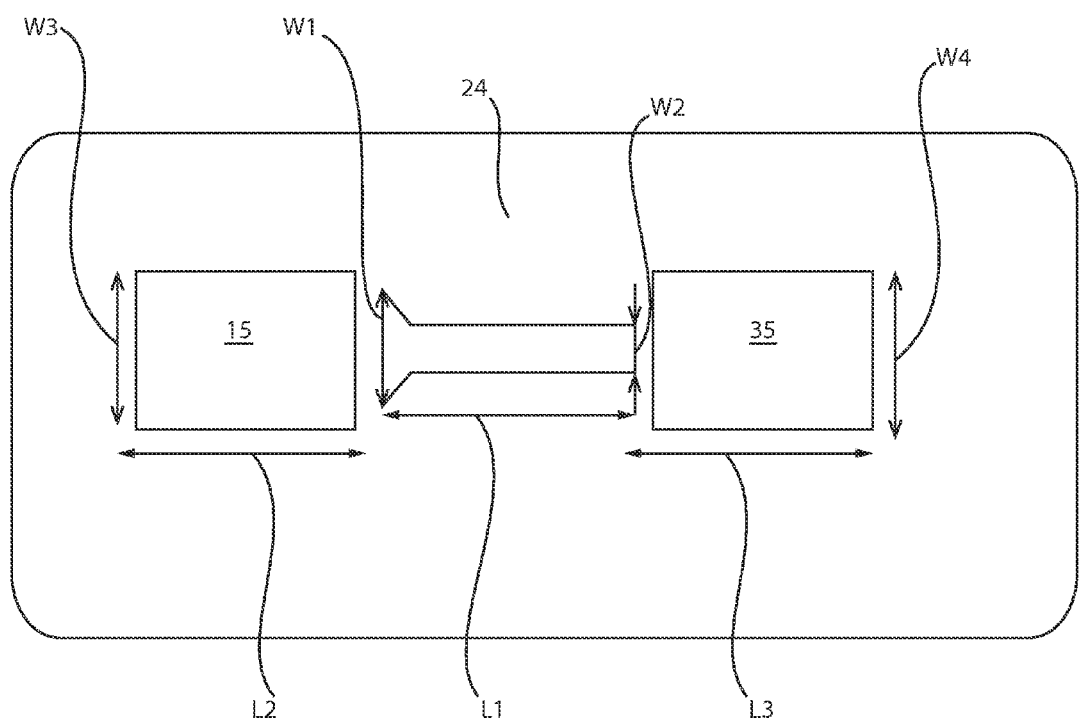
FIG. 2 is a top down view illustrating the geometry of the dielectric wave guide, in accordance with one embodiment of the present disclosure.

Referring to FIG. 2, the optoelectronic light emission device 15 may have a width W3 ranging from 3 microns to 5 microns. The width W3 dimension of the optoelectronic light emission device 15 is along a dimension perpendicular to the direction along which the optoelectronic light emission device 15 emits a beam of light. In some embodiments, the width W3 may range from 3.75 microns to 4.25 microns, and in one example is equal to 4 microns. The length L3 of the optoelectronic light emission device 15 may range from approximately 50 microns to approximately 100 microns. In one example, the length L3 of the optoelectronic light emission device 15 may be approximately 80 microns.

Referring to FIG. 1, in some embodiments, the end of the active portion of the SOI layer 4 that provides the source or drain region 11a, 12a of the first semiconductor device 10 is separated, and electrically isolated, from the sidewall of the optoelectronic light emission device 15 by an isolation dielectric material 19. The isolation dielectric material 19 may be composed of any dielectric material, and may also be present underlying the dielectric waveguide 25, as well as being present between the SOI layer 4 that the second semiconductor device 40 is formed on and the sidewall of the optoelectronic light detection device 35. In some examples, the isolation dielectric material 19 may composed of an oxide, such as silicon oxide (SiO$_2$). In another example, the isolation dielectric material 19 may be composed of a nitride, such as silicon nitride. It is noted that the above examples are provided for illustrative purposes only, and that other dielectric compositions may be suitable for the isolation dielectric material 19.

The second portion 30 of the SOI substrate 5 has been processed to provide a dielectric waveguide 25 between the optoelectronic light emission device 15 that is present in the first portion 20 of the SOI substrate 5 and the optoelectronic light detection device 35 that is present in the third portion 45 of the SOI substrate 5. Typically, the function of the dielectric wave guide 25 is to receive the beam of light being emitted from the optoelectronic light emission device 15 and to transmit that beam of light to another portion of the SOI substrate 5. For example, the beam of light may be transmitted to the optoelectronic light detection device 35.

In some embodiments, the dielectric wave guide 25 is composed of a dielectric material that is selected from the group consisting of silicon oxide, silicon nitride, silicon oxynitride, silicon carbide, hafnium oxide, aluminum oxide, aluminum nitride, amorphous silicon, silica and combinations thereof. The dielectric wave guide 25 typically has a tapered geometry. By "tapered" it is meant that the width of the dielectric wave guide 25 it is meant that the width of the dielectric wave guide 25 decreases along one direction from a first end of the dielectric wave guide 25 to a second end of the dielectric wave guide 25. For example, in some embodiments, the face of the dielectric wave guide 25 that is proximate to, and receives the light from the optoelectronic light emission device 15, is typically greater in width W1 than the width W2 of the face of the dielectric wave guide 25 that transmits the light to optoelectronic light detection device 35, as depicted in FIG. 2. The width of the dielectric wave guide 25 may taper gradually at a consistent rate, or the taper of the dielectric wave guide 25 may have regions in which the rate that the width of the dielectric wave guide 25 decreases is greater than the taper in other portions of the dielectric wave guide 25. In one example, the width W1 of the face of the dielectric wave guide 25 that receives the light beam from the optoelectronic light emission device 15 may range from 4 microns to 16 microns. In another embodiment, the width W1 of the face of the dielectric wave guide 25 that is adjacent to the face of the optoelectronic light emission device 15 ranges from 6 microns to 10 microns, e.g., the width W1 of the face of the dielectric wave guide 15 adjacent to the optoelectronic light emitted device 15 may be 8 microns. In one example, the width W2 of the face of the dielectric wave guide 15 that emits the light beam may range from 8 microns to 1 micron. In another example, the width W2 of the face of the dielectric wave guide 15 that emits the light beam and is adjacent to the optoelectronic light detection device 35 ranges from 5 microns to 1 micron.

Referring to FIG. 2, the dielectric wave guide 25 is positioned to have a length L1 along the direction that light is being emitted from the optoelectronic light emission device 15. The length L1 of the dielectric wave guide 25 is positioned to align the light being emitted from the optoelectronic light emission device 15 to the optoelectronic light detection device 35. In this manner, the dielectric wave guide 25 is substantially aligned with the light being emitted from the optoelectronic light emission device 15 and is substantially aligned to direct the light received from the optoelectronic light emission device 15 to the optoelectronic light detection device 35. The length L1 of the dielectric wave guide 25 may range from 50 microns to 100 microns. In some embodiments, the length L1 of the dielectric wave guide 25 may range from 60 microns to 90 microns. For example, the length L1 of the dielectric wave guide 25 may be 80 microns.

The distance separating the emission face of the optoelectronic light emission device 15 from the receiving face of the dielectric wave guide 25 may range from 100 nm to 300 nm. In one example, the distance separating the optoelectronic light emission device 15 from the emission face of the dielectric wave guide 25 is equal to 200 nm. The distance separating the emission face of the optoelectronic light detection device 35 from the emitting face of the dielectric wave guide 25 may range from 100 nm to 300 nm. In one example, the distance separating the optoelectronic light detection device 35 from the receiving face of the dielectric wave guide 25 is equal to 200 nm.

Referring to FIG. 1, the dielectric waveguide 25 is present overlying the buried dielectric layer 3 of the SOI substrate 5, wherein at least two interlevel dielectric layers 21, 22 are present between the dielectric waveguide 25 and the buried dielectric layer 3 of the SOI substrate 5. In some embodiments, a portion of the isolation dielectric material 19 that separates the first semiconductor device 10 from the optoelectronic light emission device 15 is positioned between the interlevel dielectric layers 21, 22 and the buried dielectric layer 3.

Referring to FIG. 1, a third portion 45 of the SOI substrate 5 contains the optoelectronic light detection device 35 and the second semiconductor device 40. In some embodiments, the optoelectronic light detection device 35 may be present on a first region of the third portion 45 of the SOI substrate 5, while the second semiconductor device 40 is present on a second region of the third portion 45 of the SOI substrate 5. As will be described in greater detail below, the portion of the SOI layer 4 and the buried dielectric layer 3 that is present in the first region of the third portion 45 of the SOI substrate 5 is removed before the optoelectronic light detection device 35 is formed.

The optoelectronic light detection device 35 is typically positioned to be adjacent to the dielectric waveguide 25. For example, at least a portion of the optoelectronic light detection device 35 is formed within the same level of the electronic device as the second semiconductor device 40. For example, the first conductivity type III-V semiconductor material layer 35a of the optoelectronic light detection device 35 may have a lower surface that is approximately coplanar with a lower surface, i.e., bottom surface of the SOI layer 4, of the second semiconductor device 40. In the embodiment depicted in FIG. 1, the upper surface of the optoelectronic light detection device 35, i.e., the second conductivity type III-V semiconductor material layer 35c, may extend above the upper surface of the second semiconductor device 40.

In some embodiments, the optoelectronic light detection device 35 is formed directly on a buffer layer 18b (hereafter referred to as second buffer layer), wherein the second buffer layer 18b is formed directly on the base semiconductor substrate 2 portion of the SOI substrate 5, which is typically composed of a type IV semiconductor material. The second buffer layer 18b may have a lattice dimension between a lattice dimension for the base semiconductor substrate 2 (also referred to as the base semiconductor layer) and the first conductivity type III-V semiconductor material layer 35a (also referred to the base III-V semiconductor layer) of the optoelectronic light detection device 35. The second buffer layer 18b may be composed of a semiconductor material that is selected from the group consisting of Ge, GaP, GaAs, InP and combinations thereof. The thickness of the second buffer layer 18b may range from 5 nm to 5,000 nm. As will be discussed in greater detail below, the SOI layer 4 and the buried dielectric layer 3 are removed from the first region of the third portion 45 of the SOI substrate 5 so that the second buffer layer 18b may be formed directly on the base semiconductor substrate 2 of the SOI substrate 5.

In some embodiments, the optoelectronic light detection device 35 may be a photodetector composed of III-V compound semiconductors. Examples of III-V compound semiconductor materials that can be employed in the material layers of the optoelectronic light detection device 35 include (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof. The photodetector converts the light signal into electrical signal. If the light is modulated at the emitter, the photodetector reconstruct this modulation back into the electrical domain.

In some embodiments, the optoelectronic light detection device 35 includes a first conductivity III-V semiconductor layer 35a, an intrinsic III-V semiconductor material layer 35b, and a second conductivity III-V semiconductor material layer 35c. The first conductivity type III-V semiconductor material layer 35a of the optoelectronic light detection device 35 may be doped to an n-type conductivity. The n-type dopant that may be present in the first conductivity type III-V semiconductor material layer 35a in a concentration ranging from $1 \times 10^{17}$ cm$^{-3}$ to $1 \times 10^{20}$ cm$^{-3}$. In some embodiments, the composition of the first conductivity type III-V semiconductor material layer 35 may be selected from the group consisting of GaAs, InP, AlGaAs, InAlAs, and combinations thereof. The first conductivity type III-V semiconductor material layer 35a may have a thickness ranging from 1.0 micron to 2.0 microns. The first conductivity type III-V semiconductor material layer 35a is present in direct contact with the second buffer layer 18b.

The intrinsic III-V semiconductor material layer 35b of the optoelectronic light detection device 35 is typically undoped, but may include some unintentional dopant from the first and second conductivity type III-V semiconductor material layers 35a, 35c that results from diffusion effects. The maximum concentration of n-type or p-type dopant that may be unintentionally be present in the intrinsic III-V semiconductor material layer 35b can be equal to $5 \times 10^{16}$ cm$^{-3}$. The intrinsic III-V semiconductor material layer 35b may be composed of at least one of GaAs, InP, AlGaAs, InAlAs and combinations thereof. The intrinsic III-V semiconductor material layer 35b may be composed of a single composition or may be a multilayered structure of multiple compositions. The thickness of the III-V semiconductor material layer 35b may range from 10 nm to 1000 nm. The intrinsic II-V semiconductor material layer 35b may be present directly on an upper surface of the first conductivity type III-V semiconductor material layer 35a.

The second conductivity type III-V semiconductor material layer 35c of the optoelectronic light detection device 35 may have an opposite conductivity type of the first conductivity type III-V semiconductor material layer 35a. For example, the second conductivity III-V semiconductor material layer 35c may have a p-type conductivity. The p-type dopant that may be present in the second conductivity type III-V semiconductor material layer 35c in a concentration ranging from $1 \times 10^{17}$ cm$^{-3}$ to $1 \times 10^{20}$ cm$^{-3}$. In some embodiments, the composition of the second conductivity type III-V semiconductor material layer 35c may be selected from the group consisting of GaAs, InP, AlGaAs, InAlAs, and combinations thereof. The second conductivity type III-V semiconductor material layer 35c may have a thickness ranging from 1.0 micron to 2.0 microns. The second conductivity type III-V semiconductor material layer 35c is present in direct contact with the second intrinsic III-V semiconductor layer 35b.

Referring to FIG. 2, the optoelectronic light detection device 35 may have a width W4 ranging from 3 microns to 5 microns. The width W4 dimension of the optoelectronic light detection device 35 is along a dimension perpendicular to the direction along which the optoelectronic light detection device 10 emits a beam of light. In some embodiments, the width W4 may range from 3.75 microns to 4.25 microns, and in one example is equal to 4 microns. The length L3 of the optoelectronic light detection device 35 may range from approximately 50 microns to approximately 100 microns. In one example, the length L3 of the optoelectronic light detection device 35 may be approximately 80 microns.

The second region of the third portion 45 of the SOI substrate 5 includes the second semiconductor device 40. The second semiconductor device 40 has been described above, and may have a conductivity type that is opposite the conductivity type of the first semiconductor device 10. For example, when the first semiconductor device 10 has an n-type conductivity, the second semiconductor device 40 has a p-type conductivity, and when the first semiconductor device 10 has a p-type conductivity, the second conductivity semiconductor device 40 has an n-type conductivity. As depicted in FIG. 1, the second semiconductor device 4 may be a field effect transistor (FET) that includes a gate structure 13b, source region 11b and drain region 12b. The description of the source region 11b, drain region 12b and the gate structure 13b including the at least one gate conductor 16b and the at least one gate dielectric 12b has been provided above. The source and drain regions 11b, 12b of the second semiconductor device 40 has been formed in the portion of the SOI layer 4 that is present within the third portion 45 of the SOI substrate 5. Referring to FIG. 1, in some embodiments, the end of the active portion of the SOI layer 4 that provides the source or drain region 11b, 12b of the second semiconductor device 40 is separated, and electrically isolated, from the sidewall of the optoelectronic light detection device 35 by an isolation dielectric material 19.

The first region of the first portion 20 and the second region of the third portion 45 of the SOI substrate 5 may further include a plurality of interlevel dielectric layers 21, 22, 23, 24 over the first and second semiconductor devices 10, 40. A portion of the plurality of interlevel dielectric layers 21, 22, 24 are present in the second portion 30 of the SOI substrate 5. The interlevel dielectric layers 21, 22, 23, 24 are formed for device isolation, and are a part of the process for forming the interconnect wiring, i.e., vias 26a, 26b, 26c, 26d and lines 27a, 27b, 27c, 27d that provide for electrical communication to the semiconductor devices, e.g., first and second semiconductor devices 10, 40, that are present on the SOI substrate 5. The interconnect wiring, i.e., vias 26a, 26c and lines 27a, 27c, that are present in the first portion 20 of the SOI substrate 5 also provide for electrical communication between the first semiconductor device 10 and the optoelectronic light emission device 15. The interconnect wiring, i.e., vias 26b, 26d and lines 27b, 27d, in the third portion 45 of the SOI substrate 5 provide for electrical communication between the optoelectronic light detection device 35 and the second semiconductor device 40.

The composition of the interlevel dielectric layers 21, 22, 23, 24 is selected to allow for selective etching between the adjacent dielectric layers. Compositions that are suitable for the interlevel dielectric layers may be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the interlevel dielectric layer include any of the aforementioned materials in porous form, or in a form that changes during processing to or from being porous and/or permeable to being non-porous and/or non-permeable.

The interconnect wiring, i.e., vias 26b and lines 27b, may be composed of an electrically conductive material. "Electrically conductive" as used through the present disclosure means a material typically having a room temperature conductivity of greater than $10^{-8}$ $(-m)^{-1}$. For example, the interconnect wiring may be composed of a conductive metal. The conductive metal may include, but is not limited to, tungsten, copper, aluminum, silver, gold and alloys thereof.

Figure 3:
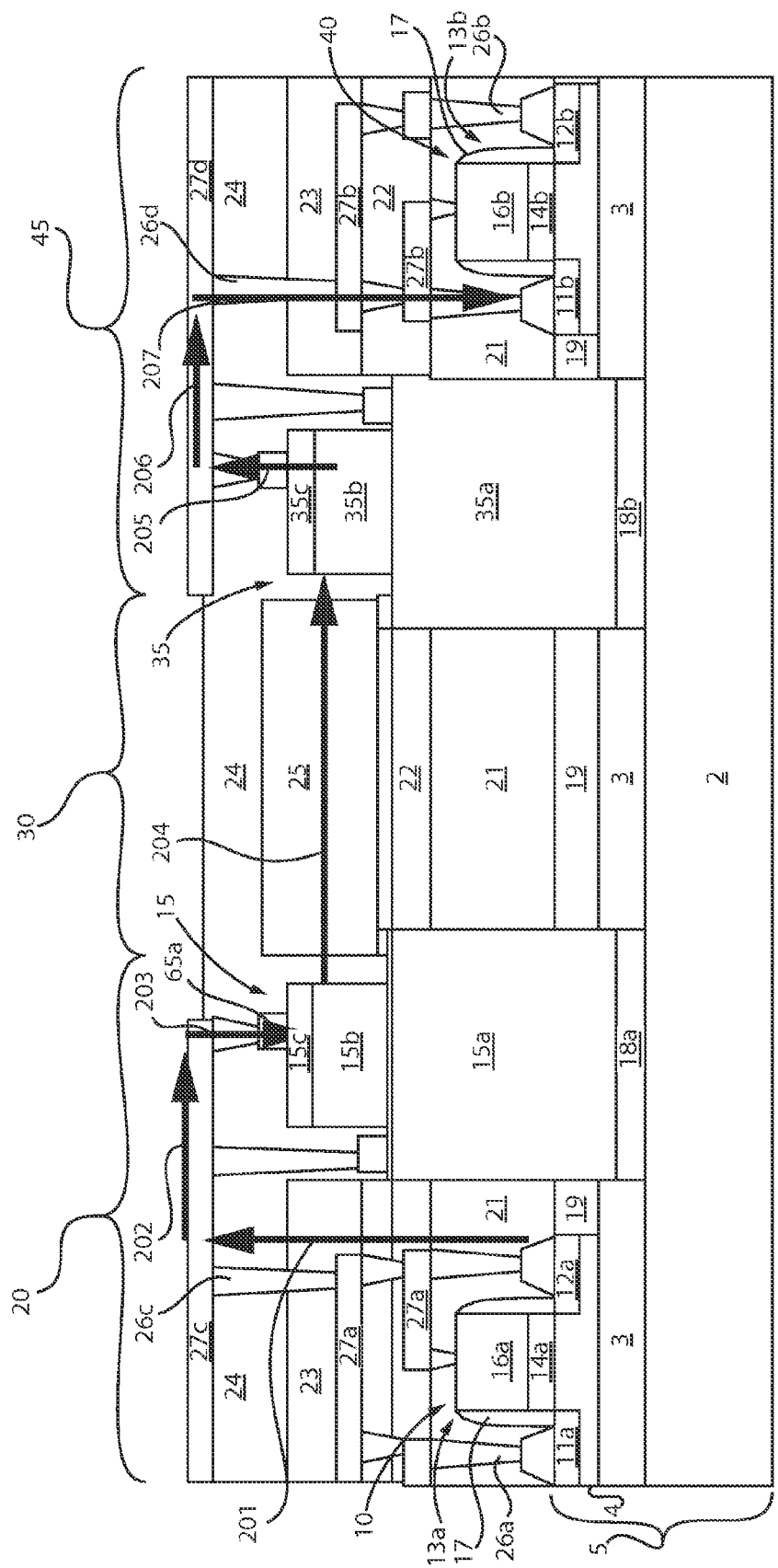
FIG. 3 is a side cross-sectional view depicting one embodiment of data transmission through the electrical device that is depicted in FIG. 1, in accordance with one embodiment of the present disclosure.

FIG. 3 depicts one embodiment of data transmission through the electrical device that is depicted in FIGS. 1 and 2. The combination of the optoelectronic light emission device 15, the dielectric waveguide 15 and the optoelectronic light detecting device 35 provide an optical interconnect. In the embodiment depicted in FIG. 3, the optoelectronic light emission device 15, the dielectric waveguide 15 and the optoelectronic light detecting device 35 provide an optical interconnect for data transmission between the first and second semiconductor devices 10, 40.

In one embodiment, data generated by the first semiconductor device 10 in the first portion 20 of the SOI substrate 5 is transmitted by electrical communication through the vias and interconnects 26a, 26c, 27a, 27c to the optoelectronic light emission device 15. As used herein, the term "electrical communication" means that a first structure or material can conduct electricity, i.e., is electrically conductive, to a second structure or material. Data transmission by electrical communication across the vias and interconnects 26a, 26c, 27a, 27c is depicted by arrows 201, 202, 203 in which the rate of data propagation may range from 1 to 10 Gb/s to ~50 Gb/s. The data generated by the first semiconductor device 10 is converted into an optical signal by the optoelectronic light emission device 15, which is typically a high-speed laser. The arrow identified by reference number 204 illustrates the optical transmission of the optical signal being emitted by the optoelectronic light emission device 15 through the dielectric waveguide 25 in the second portion 30 of the SOI substrate 5 to the optoelectronic light detection device 35 in the third portion 45 of the SOI substrate 5.

Optical transmission is faster than electrical communication. For example, optical transmission of the optical signal from the optoelectronic light emission device 15 to the optoelectronic light detection device 35 through the dielectric waveguide 25 may be at a rate ranging from 50 Gb/s (1 wavelength channel), to as great as 400 Gb/s (8 wavelength channel) without wavelength division multiplexing.

The optical signal is received by the optoelectronic light detection device 35 that is present in the third portion 45 of the SOI substrate 5, and is converted by the optoelectronic light detection device 35 from an optical signal to an electrical signal, which is typically a high-speed photodetector. The electrical signal is then transmitted by electrical communication, as depicted by arrows 205, 206, 207, through the vias and interconnects 26b, 26d, 27b, 27d to the second semiconductor device 40 that is present in the third portion 45 of the SOI substrate 5. The rate of data propagation through the vias and interconnects 26b, 27b may range from a few Gb/s to ~50 Gb/s. It is noted that the example depicted in FIG. 3 is provided for illustrative purposes only, and is not intended to limit the present disclosure solely thereto.

It is noted that the above structural and compositional examples described above with reference to FIGS. 1-3 are provided for illustrative purposes only, and are not intended to limit the present disclosure to only the above described examples. The structures and methods of the present disclosure, are now described in more detail with reference to FIGS. 1 to 8.

Figure 4:
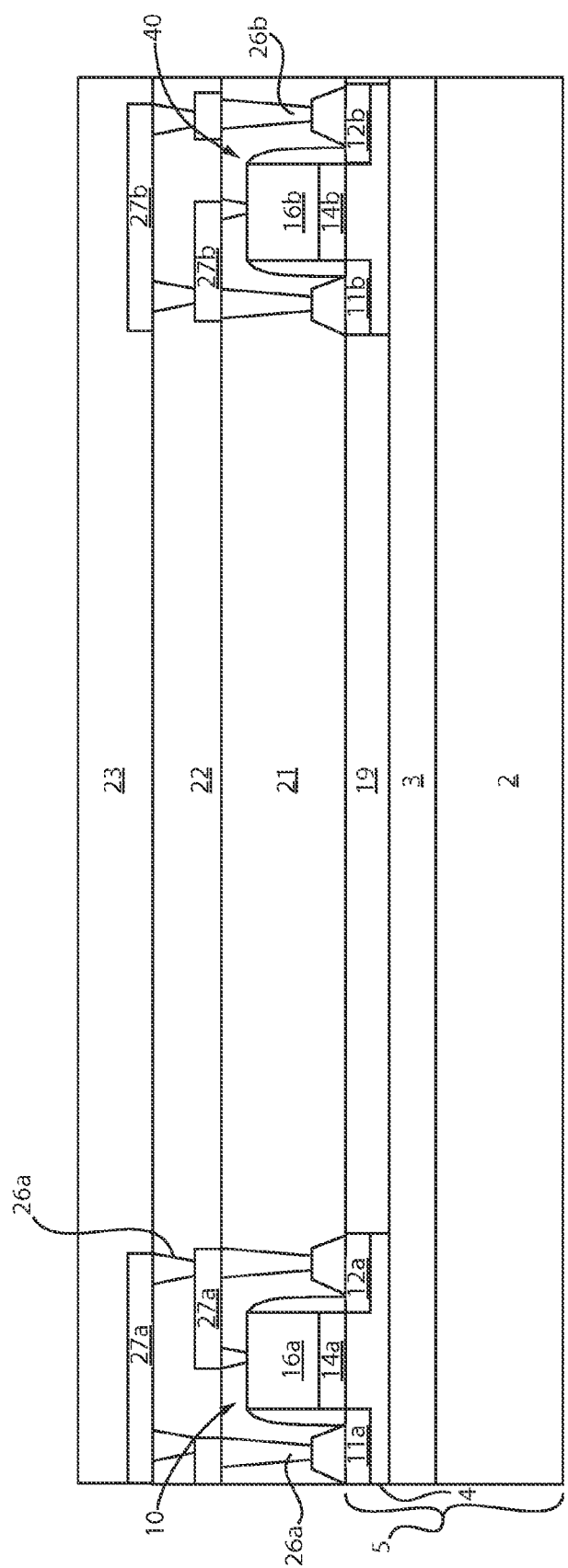
FIG. 4 is aside cross-sectional view depicting semiconductor devices present on a semiconductor on insulator (SOI) substrate following back end of the line (BEOL) processing for the semiconductor devices, in accordance with one embodiment of the present disclosure.

FIG. 4 depicts one embodiment at least one semiconductor device 10, 40 being formed on an SOI substrate 5 following back end of the line (BEOL) processing for the semiconductor devices. The SOI substrate 5 includes an SOI layer 4, buried dielectric layer 3, and base semiconductor substrate 2, as described above with reference to FIGS. 1-3. The SOI substrate 5 may be formed by a thermal bonding process, or alternatively, the SOI substrate 5 may be formed by an oxygen implantation process, which is referred to in the art as a separation by implantation of oxygen (SIMOX). In other embodiments, deposition may be used to form the buried dielectric layer 3 on a bulk semiconductor substrate 2. In this embodiment, the SOI layer 4 may then be deposited on the buried dielectric layer 3 to provide the SOI substrate 5.

FIG. 4 depicts one embodiment of patterning the SOI substrate 5 to provide islands of a remaining portion of the SOI layer 4 in the first portion 20 of the SOI substrate 5 and the third portion 45 of the SOI substrate 5. These islands of remaining portions of the SOI layer 4 can provide the site for the formation of the first and second semiconductor devices 10, 40.

Patterning the SOI substrate 5 may include deposition, photolithography and etch processes. Specifically, in one example, a photoresist mask (not shown) is formed overlying the SOI layer 4 of the SOI substrate 5, in which the portion of the SOI layer 4 that is underlying the photoresist mask provides the remaining portion of the SOI layer 4 that is present in the first and third portions 20, 45 of the SOI substrate 5. The exposed portions of the SOI layer 5, which are not protected by the photoresist mask, are removed using a selective etch process. To provide the photoresist mask, a photoresist layer is first positioned on the SOI layer 5. The photoresist layer may be provided by a blanket layer of photoresist material that is formed utilizing a deposition process such as, for example, chemical vapor deposition, plasma enhanced chemical vapor deposition, evaporation or spin-on coating. The blanket layer of photoresist material is then patterned to provide the photoresist mask utilizing a lithographic process that may include exposing the photoresist material to a pattern of radiation and developing the exposed photoresist material utilizing a resist developer.

Following the formation of the photoresist mask, a selective etching process may remove the unprotected portions of the SOI layer 4. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material, i.e., SOI layer 4, selectively to a second material, i.e., buried dielectric layer 3, by a ratio of 100:1 or greater.

For example, the transferring of the pattern provided by the photoresist into the underlying structures may include an anisotropic etch. As used herein, an "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation.

FIG. 4 also depicts one embodiment of filling the portions of the SOI substrate 5 from which the SOI layer 4 was removed with an isolation dielectric material 19. The isolation dielectric material 19 may be formed using a deposition process. For example, the isolation dielectric material 19 may be deposited using chemical vapor deposition (CVD). Variations of CVD processes include, but not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. The isolation dielectric material 19 may also be deposited using chemical solution deposition, spin or deposition, or in some cases may be formed using thermal growth processes, such as thermal oxidation, nitridation or a combination thereof. Following deposition of the isolation dielectric material 19, the structure may be planarized using a planarization process, such as chemical mechanical planarization (CMP).

FIG. 4 also depicts forming the first and second semiconductor devices 10, 40 on the remaining portions of the SOI layer 4 in the first portion 20 and the third portion 45 of the SOI substrate 5. In some embodiments, the first and second semiconductor devices 10, 40 may be composed of FETS. One example of a process sequence for forming a FET device includes depositing a layered stack including at least one gate dielectric material and at least on gate conductor material, and patterning and etching the layered stack to provide a gate structure 13a, 13b. At least one gate sidewall spacer 17 may then be formed on the sidewall of the gate structure 13a, 13b using deposition and etch back methods. Source and drain regions 11a, 11b, 12a, 12b may be formed in the SOI layer 4 on opposing sides of the gate structures 13a, 13b by ion implantation of an n-type or p-type dopant. In some embodiments, raised source and drain regions structures may be formed. Block masks, e.g., photoresist block masks, may be employed to selectively process the first and third portions 10, 45 of the SOI substrate 5 so that the first and second semiconductor devices 10, 40 may be devices of a different conductivity, e.g., n-type conductivity FET or p-type conductivity FET.

Still referring to FIG. 4, a first interlevel dielectric layer 21 may be blanket deposited covering the entirety of the SOI substrate 5 including the first and second semiconductor devices 10, 40. The first interlevel dielectric layer 21 may be deposited using a chemical vapor deposition process, such as metal organic chemical vapor deposition, high density plasma chemical vapor deposition, or plasma enhanced chemical vapor deposition. Following deposition of the first interlevel dielectric layer 21, via openings may be formed through the interlevel dielectric layer to the source region 11a, 11b, drain region 12a, 12b, and the gate structures 13a, 13b. The via openings may be formed using photolithography and etch processes. The via openings may be filled with a conductive material, such as a metal, to provide a first set of electrically conductive vias 26a, 26b. The conductive material may be deposited using a physical vapor deposition (PVD) process, such as plating or sputtering. Electrically conductive lines 27a, 27b may then be formed on the first interlevel dielectric layer 21, and may be in electrically communication with the first set of vias 26a, 26b. The electrically conductive lines 27a, 27b may be composed of an electrically conductive material that is similar to the electrically conductive material of the vias 26a, 26b. The electrically conductive lines 27a, 27b may be formed using physical vapor deposition and selective etch processing.

A second interlevel dielectric layer 22 may then be blanket deposited atop the first interlevel dielectric layer 21. A second set of electrically conductive vias 26a, 26b may then be formed through the second interlevel dielectric layer 22 and a second set of electrically conductive lines 27a, 27b may be formed atop the second interlevel dielectric layer 22. The second set of electrically conductive vias 26a, 26b may be in electrical communication with the electrically conductive lines 27a, 27b that are present on the first interlevel dielectric layer 21. A third interlevel dielectric layer 23 may be formed atop the second interlevel dielectric layer 22.

Figure 5:
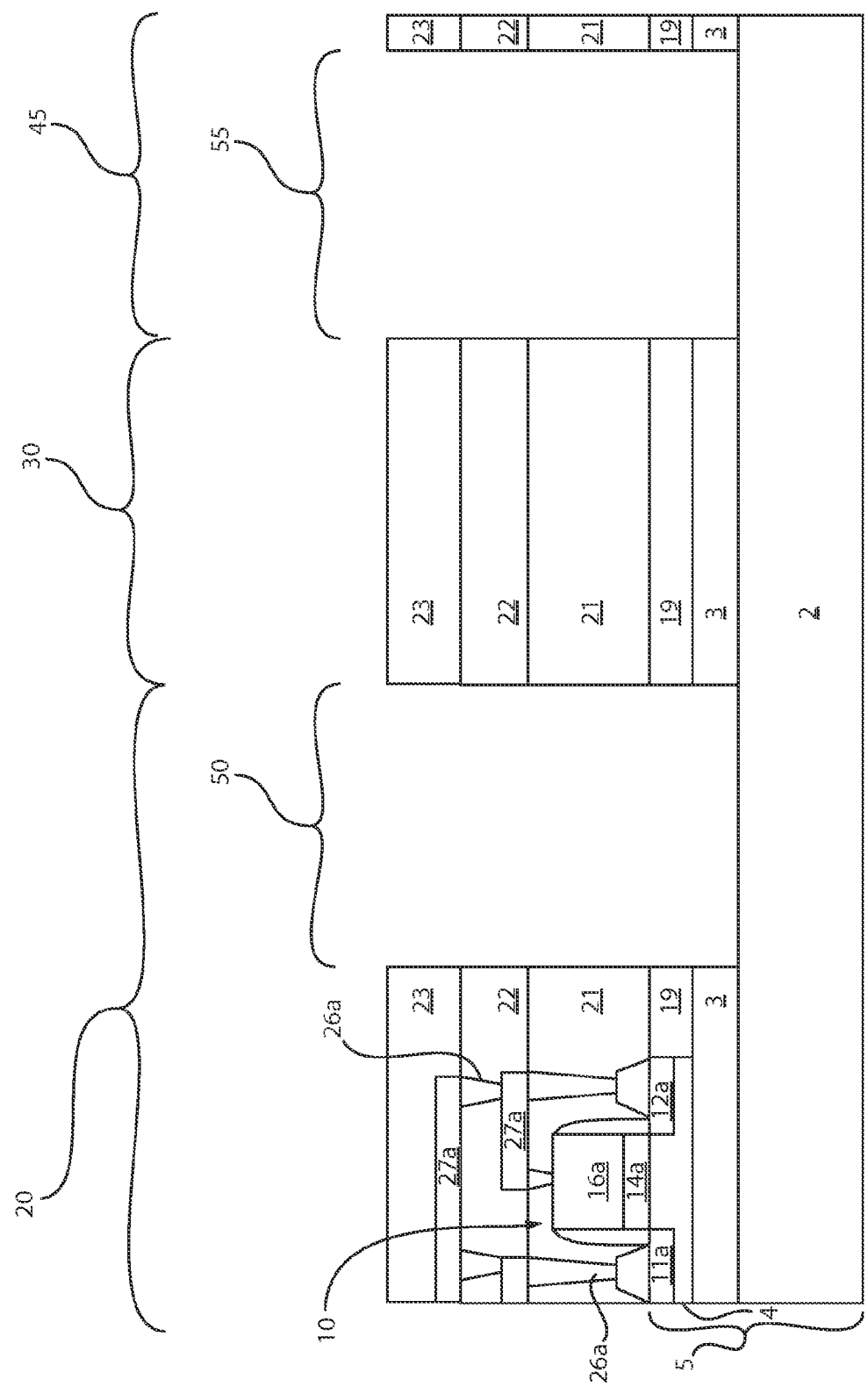
FIG. 5 is a side cross-sectional view depicting removing a portion of the SOI layer and the buried dielectric layer of the SOI substrate to expose portions of the base semiconductor layer that are adjacent to each of the semiconductor devices, wherein an island of a remaining portion that least the buried dielectric layer is present between the exposed portions of a base semiconductor substrate, in accordance with one embodiment of the present disclosure.

FIG. 5 depicts one embodiment of removing a portion of the SOI layer 4 and the buried dielectric layer 3 of the SOI substrate 5 to expose portions of the base semiconductor substrate 2 that are adjacent to each of the first and second semiconductor devices 10, 40. In some embodiments, an island of a remaining portion of at least the buried dielectric layer 3 is present between the exposed portions of the base semiconductor layer 2. Typically, the etch process described with reference to FIG. 5 also remove the first, second and third interlevel dielectric layers 21, 22, 23 and the isolation dielectric material 19 from the portions of the SOI substrate 5 in which the optoelectronic light emission device 15 and the optoelectronic light detection device 35 are subsequently formed. The etch process depicted in FIG. 5 forms a first opening 50 in a first portion 20 of the SOI substrate 5 in which the optoelectronic light emission device 15 is formed, and forms a second opening 55 in the third portion 45 of the SOI substrate 5 in which the optoelectronic light detection device 35 is formed.

Exposing the base semiconductor substrate 2 in the portions of the SOI substrate 5 in which the optoelectronic light emission device 15 and the optoelectronic light detection device 35 are formed may include deposition, photolithography and etch processes. Specifically, in one example, a photoresist mask (not shown) is formed overlying the third interlevel dielectric layer 23, in which the exposed portions of the third interlevel dielectric layer 23, and the underlying portions of the second interlevel dielectric layer 22, the first interlevel dielectric layer 21, the layer of isolation dielectric material 19, and the buried dielectric layer 3, which are not protected by the photoresist mask, are removed using a selective etch process. The photoresist mask is formed using similar methods for forming the photoresist mask for defining the SOI layer 4 in the first and third portions 20, 45 of the SOI substrate 5.

Following the formation of the photoresist mask, a selective etching process may remove the unprotected portions of the third interlevel dielectric layer 23, the second interlevel dielectric layer 22, the isolation dielectric material 19, and the buried dielectric layer 3. The etch process may be an anisotropic etch. The anisotropic etch may include reactive-ion etching (RIE). Other examples of anisotropic etching that can be used at this point of the present disclosure include ion beam etching, plasma etching or laser ablation.

Figure 6:
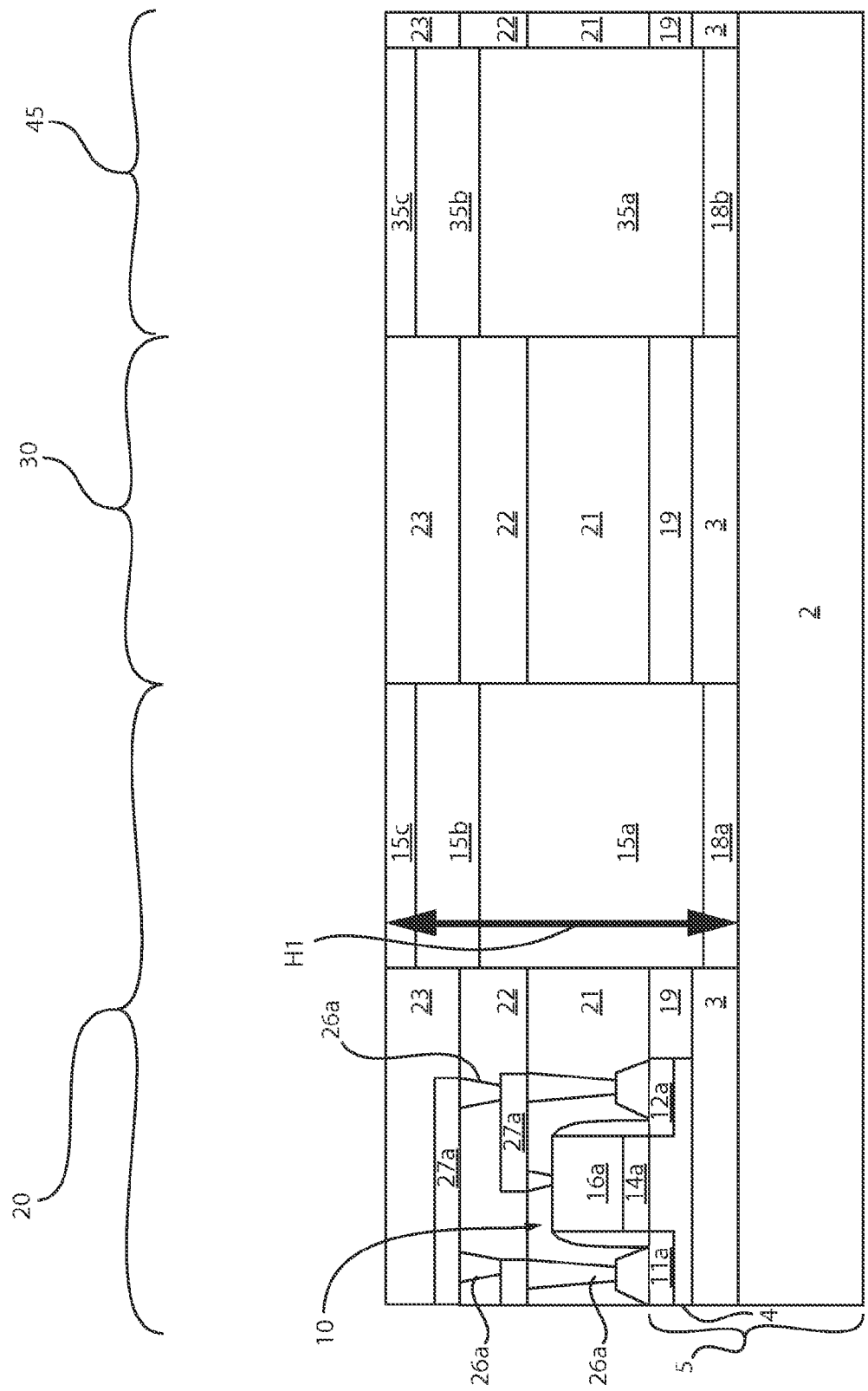
FIG. 6 is aside cross-sectional view depicting forming an optoelectronic light emission device comprising type III-V semiconductor materials on an exposed portion of the base semiconductor substrate that is adjacent to a first semiconductor device, and forming, an optoelectronic light detection device comprising type III-V semiconductor material on an exposed portion of the base semiconductor layer adjacent to a second semiconductor device, in accordance to one embodiment of the present disclosure.

FIG. 6 depicts one embodiment of forming the material layers for the optoelectronic light emission device 15 comprising type III-V semiconductor materials within the first opening 50 on an exposed portion of the base semiconductor substrate 2 adjacent to the first semiconductor device 10, and forming the material layers for the optoelectronic light detection device 35 comprising type III-V semiconductor material within the second opening 55 on the exposed portion of the base semiconductor substrate 2 adjacent to the second semiconductor device 40. In some embodiments, prior to depositing the material layers for the optoelectronic light emission device 15 and the optoelectronic light detection device 35, a first and second buffer layer 18a, 18b are formed on the exposed upper surfaces of the base semiconductor substrate 2. The material layers of the optoelectronic light emission device 15, and the optoelectronic light detection device 35, as well as the first and second buffer layers 18a, 18b, are epitaxially grown. The term "epitaxial material" denotes a semiconductor material that has been formed using an epitaxial growth and/or epitaxial deposition process. "Epitaxial growth and/or epitaxial deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled, and the system parameters set correctly, the depositing atoms of an epitaxial deposition process arrive at the deposition surface with sufficient energy to move around on the surface and orient themselves to the crystal arrangement of the atoms of the deposition surface. An epitaxial material has substantially the same crystalline characteristics as the semiconductor material of the deposition surface. For example, an epitaxial film deposited on a {100} crystal surface will take on a {100} orientation. The epitaxial deposition process may be carried out in the deposition chamber of a chemical vapor deposition (CVD) apparatus.

The base semiconductor substrate 2 is typically composed of a type IV semiconductor material, such as silicon, germanium or silicon germanium. The first and second buffer layers 18a, 18b are selected to have a lattice dimension between the lattice dimension of the type IV semiconductor material of the base semiconductor substrate 2 and the base layer of III-V semiconductor material for the optoelectronic light emission device 15 and the optoelectronic light detection device 35. By providing a lattice dimension between the base semiconductor substrate 2 and the base of the optoelectronic light emission device 15 and/or optoelectronic light detection device 35, the first and second buffer layers 18a, 18b reduce the concentration of defects and undesired stresses in the optoelectronic light emission device 15 and/or optoelectronic light detection device 35. The material composition for the first buffer layer 18a may be the same or different than the material composition for the second buffer layer 18b. In the embodiments, to provide for different material compositions for the first and second buffer layer, as well as the different III-V material layers of the optoelectronic light emission device 15 and/or optoelectronic light detection device 35, block masks may allow for selective processing of specific regions of the SOI substrate 5.

In some embodiments, when the first and second buffer layer 18a, 18b is composed of a type III-V compound semiconductor, a number of different sources may be utilized for the deposition of the first and second buffer layer 18a, 18b. In some embodiments, the sources for epitaxial growth of type III-V semiconductor material include solid sources containing In, Ga, N, P elements and combinations thereof and/or a gas precursor selected from the group consisting of trimethylgallium (TMG), trimethylindium (TMI), tertiary-butylphosphine (TBP), phosphine ($PH_3$), ammonia ($NH_3$), and combinations thereof. The temperature for epitaxial deposition of type III-V semiconductor materials typically ranges from 550° C. to 900° C. Although higher temperature typically results in faster deposition, the faster deposition may result in crystal defects and film cracking.

Following the formation of the first and second buffer layers 18a, 18b, the first layer that provides the base of the optoelectronic light emission device 15 and/or the optoelectronic light detection device 35 may be formed. In some embodiments, the first conductivity type III-V semiconductor material layer 15a of the optoelectronic light emission device and/or the first conductivity type III-V semiconductor material layer 35a of the optoelectronic light detection device 35 may be formed using an epitaxial deposition process. For example, the first conductivity type III-V semiconductor material layer 15a of the optoelectronic light emission device and/or the first conductivity type III-V semiconductor material layer 35a of the optoelectronic light detection device 35 may be doped to an n-type conductivity. In other examples, the first conductivity type III-V semiconductor material layer 15a of the optoelectronic light emission device and/or the first conductivity type III-V semiconductor material layer 35a of the optoelectronic light detection device 35 may be doped to a p-type conductivity. The dopant may be introduced via ion implantation or via in situ implantation. The effect of the dopant atom, i.e., whether it is a p-type or n-type dopant, depends occupied by the site occupied by the dopant atom on the lattice of the base material. In a III-V semiconductor, atoms from group II act as acceptors, i.e., p-type, when occupying the site of a group III atom, while atoms in group VI act as donors, i.e., n-type, when they replace atoms from group V. Dopant atoms from group IV, such a silicon (Si), have the property that they can act as acceptors or donor depending on whether they occupy the site of group III or group V atoms respectively. Such impurities are known as amphoteric impurities.

The first conductivity type III-V semiconductor material layer 15a of the optoelectronic light emission device and/or the first conductivity type III-V semiconductor material layer 35a of the optoelectronic light detection device 35 are typically grown to a thickness ranging from 1 micron to 2 microns. Examples of the precursor gasses for epitaxial growth of the first conductivity type III-V semiconductor material layer 15a of the optoelectronic light emission device and/or the first conductivity type III-V semiconductor material layer 35a of the optoelectronic light detection device 35 have been described above. As indicated above, it is not necessary that the first conductivity type III-V semiconductor material layer 15a of the optoelectronic light emission device be the same composition as the first conductivity type III-V semiconductor material layer 35a of the optoelectronic light detection device 35. In the embodiments, in which the first conductivity type III-V semiconductor material layer 15a of the optoelectronic light emission device has a different composition than the first conductivity type III-V semiconductor material layer 35a of the optoelectronic light detection device 35, block masks may be employed to individually process the first and third portions 20, 45 of the SOI substrate 5.

Following formation of the first conductivity type III-V semiconductor material layer 15a of the optoelectronic light emission device 15, the material layers of the III-V multiple quantum well layered stack 15b may be epitaxially formed on the first conductivity type III-V semiconductor material layer 11 that provides a first conductivity cladding layer. The III-V multiple quantum well layered stack 12 is typically a layered stack of intrinsic semiconductor materials. Each material layer of the III-V multiple quantum well layered stack 15b can be formed using an epitaxial deposition process, which may be carried out in the deposition chamber of a CVD apparatus. The epitaxial deposition process for forming the III-V multiple quantum well layered stack 15b may be a selective epitaxial deposition process. The fact that the process is selective means that the III-V semiconductor material only on forms on the exposed semiconductor surfaces, such as the upper surface of the first conductivity type III-V semiconductor material layer 15a of the optoelectronic light emission device, and is not formed on dielectric surfaces, such as the uppermost interlevel dielectric layer 23. The different compositions of the III-V multiple quantum well layered stack 15b may be provided by changing and cycling the precursor gasses used in depositing the different compositions of the III-V compound semiconductor materials for the different layers within the III-V multiple quantum well layered stack 15b.

In some embodiments, the intrinsic III-V semiconductor material layer 35b of the optoelectronic light detection device 35 may be epitaxially formed concurrently with the III-V multiple quantum well layered stack 15b of the optoelectronic light emission device 15. In this embodiment, the intrinsic III-V semiconductor material layer 35b has the same composition as the III-V multiple quantum well layered stack 15b. In other embodiments, the intrinsic III-V semiconductor material layer 35b of the optoelectronic light detecting device 35 is epitaxially formed separately from the III-V multiple quantum well layered stack 15b of the optoelectronic light emission device 15 by employing block masks to independently epitaxially deposit III-V semiconductor material layers in each of the first and third portions 20, 45 of the SOI substrate 5.

Following the formation of the III-V multiple quantum well layered stack 15b of the optoelectronic light emission device 15 and/or the intrinsic III-V semiconductor material layer 35b of the optoelectronic light detection device 35, at least one of the second conductivity type III-V semiconductor material layer 15c of the optoelectronic light emission device 15 and the second conductivity type III-V semiconductor material layer 35c of the optoelectronic light detection device 35 may be epitaxially formed. The second conductivity type III-V semiconductor material layer 15c is formed epitaxially on an upper surface of the III-V multiple quantum well layered stack 15b of the optoelectronic light emission device 15. The second conductivity type III-V semiconductor material layer 35c is epitaxially formed on an upper surface of the intrinsic III-V semiconductor material layer 35b of the optoelectronic light emission device 35.

Each of the second conductivity type III-V semiconductor material layer 15c that is epitaxially formed on the III-V multiple quantum well layered stack 15b, and the second conductivity type III-V semiconductor material layer 35c that is epitaxially formed on the intrinsic III-V semiconductor material layer 35b, may have a conductivity type that is opposite the conductivity type of the first conductivity type III-V semiconductor material layer 15a and the first conductivity type III-V semiconductor material layer 35a, respectively. For example, when the first conductivity type III-V semiconductor material layer 15a has an n-type conductivity, the second conductivity type III-V semiconductor material layer 15c has a p-type conductivity.

Each of the second conductivity type III-V semiconductor material layer 15c that is epitaxially formed on the III-V multiple quantum well layered stack 15b, and the second conductivity type III-V semiconductor material layer 35c that is epitaxially formed on the intrinsic III-V semiconductor material layer 35b, may be formed using an epitaxial deposition process that is similar to the process described above for forming the first conductivity type III-V semiconductor material layer 15a and the first conductivity type III-V semiconductor material layer 35a. For example, each of the second conductivity type III-V semiconductor material layer 15c of the optoelectronic light emission device 15, and the second conductivity type III-V semiconductor material layer 35c of the optoelectronic light detection device 15 may be formed using an epitaxial deposition process that selectively forms III-V semiconductor material on semiconductor surfaces, and does not forms III-V semiconductor material on dielectric surfaces. The dopant of the second conductivity type III-V semiconductor material layer 15c and/or second conductivity type III-V semiconductor material layer 35c may be introduced in-situ or may be introduced to the III-V semiconductor material by ion implantation.

In some embodiments, the second conductivity type III-V semiconductor material layer 15c and the second conductivity type III-V semiconductor material layer 35c may be formed simultaneously within the first portion 20 and the second portion 45 of the SOI substrate 5. In this embodiment, the second conductivity type III-V semiconductor material layer 15c and the second conductivity type III-V semiconductor material layer 35c typically have the same composition. In other embodiments, the second conductivity type III-V semiconductor material layer 35c of the optoelectronic light detection device 35 is epitaxially formed separately from the second conductivity type III-V material layer 15c of the optoelectronic light emission device 15 by employing block masks to independently epitaxially deposit III-V semiconductor material layers in each of the first and third portions 20, 45 of the SOI substrate 5.

In some embodiments, following formation of the second conductivity type III-V semiconductor material layer 15c of the optoelectronic light emission device 15 and/or second conductivity type III-V semiconductor material layer 35c of the optoelectronic light detection device 35, the structure may be planarized, e.g., processed with chemical mechanical planarization, so that the upper surface of the material stack for the optoelectronic light emission device 15 is coplanar with the upper surface of the material stack for the optoelectronic light detection device 35.

Following formation of the second conductivity type III-V semiconductor material layer 15c of the optoelectronic light emission device 15 and/or second conductivity type III-V semiconductor material layer 35c of the optoelectronic light detection device 35, the height H1 of the materials stacks for the optoelectronic light emission device 15 and the optoelectronic light detection device 35 may range from 500 nm to 5000 nm.

Figure 7:
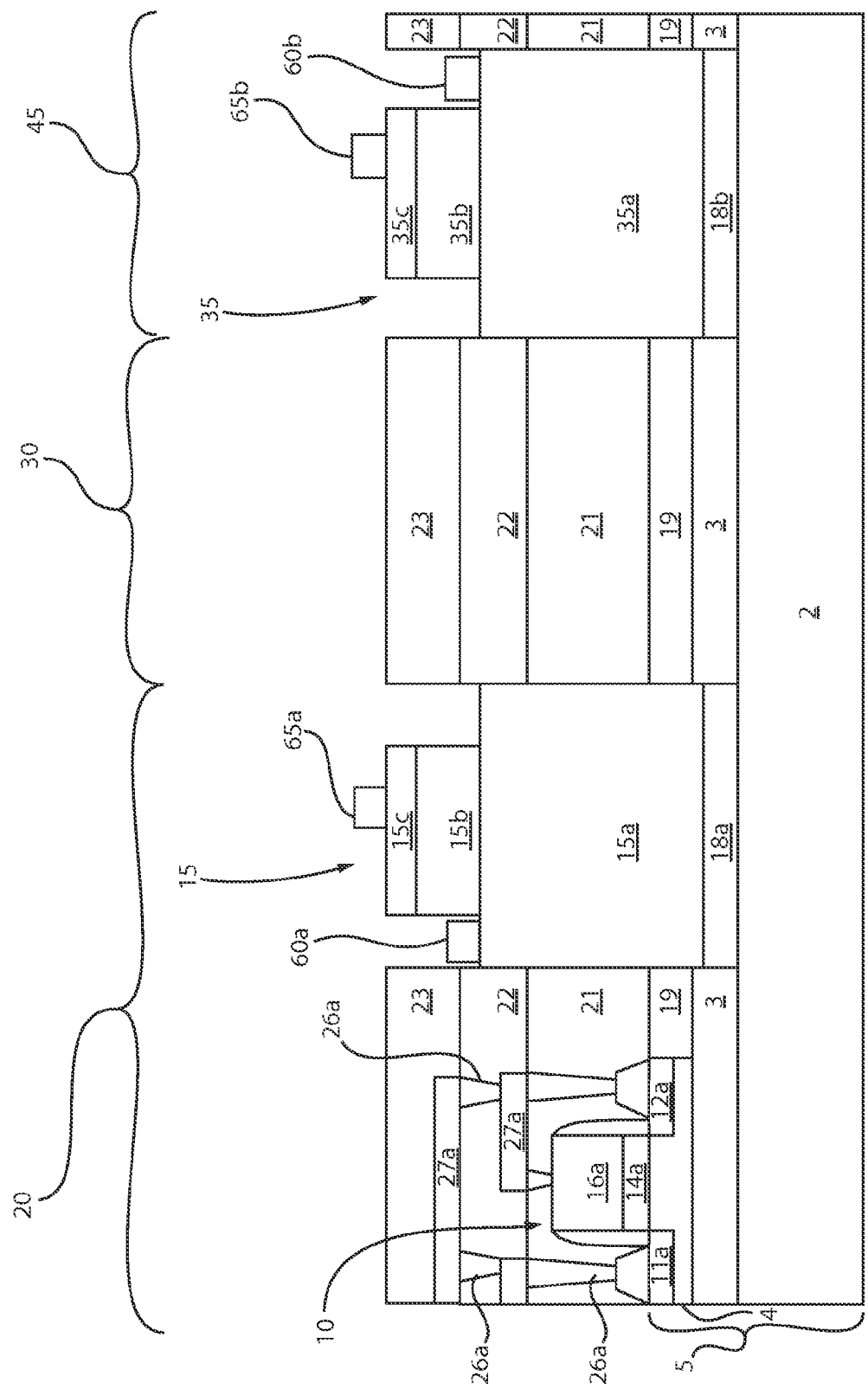
FIG. 7 is a side cross-sectional view depicting forming contacts to the optoelectronic light emission device and the optoelectronic light detection device, in accordance with one embodiment of the present disclosure.

FIG. 7 depicts one embodiment of forming contacts 60a, 60b, 65a, 65b to the optoelectronic light emission device 15 and the optoelectronic light detection device 35. In some embodiments, a first contact 60a, 60b may be formed to each of the first conductivity type III-V semiconductor material layer 15a of the optoelectronic light emission device 15, and the first conductivity type III-V semiconductor material layer 35a of the optoelectronic light detection device 35. In some embodiments, a second contact 65a, 65b may be formed to each of the second conductivity type III-V semiconductor material layer 15c of the optoelectronic light emission device 15, and the second conductivity type III-V semiconductor material layer 35c of the optoelectronic light detection device 35.

Forming the contacts 60a, 60b, 65a, 65b may begin with patterning the second conductivity type III-V semiconductor material layers 15c, 35c, the III-V multiple quantum well layered stack 15b and the intrinsic III-V semiconductor material layer 35b to expose a portion of the each of the first conductivity type III-V semiconductor material layer 15a of the optoelectronic light emission device 15 and the first conductivity type III-V semiconductor material layer 35a of the optoelectronic light detection device 35. Patterning the layered material stacks for the optoelectronic light emission device 15 and the optoelectronic light detection device 35 may include photolithography and etch processes, similar to those described above for patterning the gate structures 13a, 13b to the first and second semiconductor devices 10, 40. For example, the etch process may include an anisotropic etch, such as RIE.

The contacts 60a, 60b, 65a, 65b may be composed of a metal, which can be deposited using a physical vapor deposition (PVD) method, such as a sputtering or plating. The material layer for the contacts 60a, 60b, 65a, 65b may be deposited as a single blanket deposited layer. Following deposition, the material layer for the contacts 60a, 60b, 65a, 65b may be patterned and etched so that remaining portions are present in direct contact with the first and second conductivity type III-V material layers 15a, 35a, 15c, 35c of the optoelectronic light emission device 15 and the optoelectronic light detection device 35.

Figure 8:
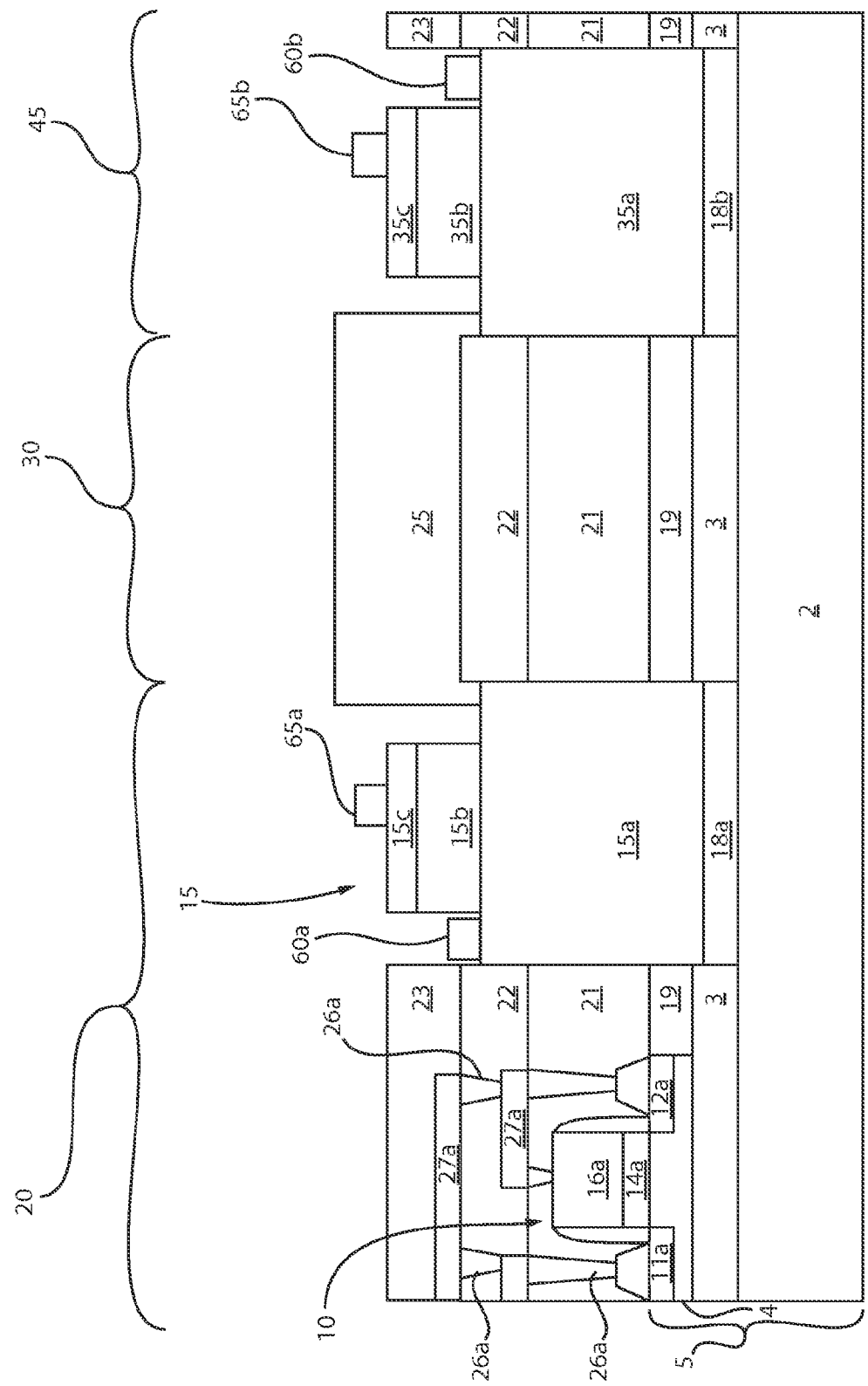
FIG. 8 is a side cross-sectional view depicting one embodiment of forming a dielectric waveguide, in accordance with the present disclosure.

FIG. 8 depicts one embodiment of forming a dielectric waveguide 25 on the island of the remaining portions of the second interlevel dielectric layer 22, the first interlevel dielectric layer 21, the isolation dielectric material 19, and the buried dielectric layer 3 that provide the second portion 30 of the SOI substrate 5. In some embodiments, forming the dielectric waveguide 25 may begin with removing the remaining portion of the third interlevel dielectric layer 23 that is present in the second portion 30 of the SOI layer 5 with a selective etch. The selective etch may be an anisotropic etch, such as RIE, or isotropic etch, such as a wet chemical etch, that is selective to the underlying second interlevel dielectric layer 23. Following removal of the third interlevel dielectric layer 23, the dielectric material for the dielectric waveguide may be blanket deposited on the structure depicted in FIG. 7 using chemical vapor deposition (CVD). Variations of CVD processes include, but not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. The dielectric material may also be deposited using chemical solution deposition, spin or deposition, or in some cases may be formed using thermal growth processes, such as thermal oxidation, nitridation or a combination thereof.

The dielectric material may then be patterned and etched to provide a dielectric waveguide 25 having the geometry depicted in FIG. 2. Patterning the dielectric material may include deposition, photolithography and etch processes. Specifically, in one example, a photoresist mask (not shown) is formed overlying the dielectric material, in which the portion of the dielectric material that is underlying the photoresist mask provides the dielectric waveguide 25. The exposed portions of the dielectric material, which are not protected by the photoresist mask, are removed using a selective etch process. Following the formation of the photoresist mask, an etching process may remove the unprotected portions of the dielectric material. For example, the transferring of the pattern provided by the photoresist into the underlying structures may include an anisotropic etch. The anisotropic etch may include reactive-ion etching (RIE). Other examples of anisotropic etching that can be used at this point of the present disclosure include ion beam etching, plasma etching or laser ablation.

Referring to FIG. 1, in a following process sequence a fourth interlevel dielectric layer 24 may be formed over the structure including the optoelectronic light emission device 15, the optoelectronic light detection device 35, and the dielectric wave guide 25 that is depicted in FIG. 8. The fourth interlevel dielectric layer 24 may be formed by chemical vapor deposition (CVD), spin on coating, solution deposition or other deposition methods.

In some embodiments, interconnect wiring, i.e., vias 26c and lines 27c, may be formed to provide electrical communication between the first semiconductor device 10 and the optoelectronic light emission device 15. Interconnect wiring, i.e., vias 26d and lines 27d, may also be formed to provide electrical communication between the second semiconductor device 40 and the optoelectronic light detection device 35. The fourth interlevel dielectric 24 and the third interlevel dielectric 23 on the first and third portions 10, 45 of the SOI substrate 5 may be patterned and etched to form via holes to the various contacts 60a, 60b, 65a, 65b of the optoelectronic light emission device 15 and the optoelectronic light detection device 35, as well as to the lines 27a, 27b that are in electrical communication with the first and second semiconductor devices 10, 40. Following via formation, interconnects 27c, 27d are formed by depositing a conductive metal into the via holes using deposition methods, such as CVD, sputtering or plating. A first line 27c may then be formed to provide electrical communication between the vias 26c to the first semiconductor device 10 and the vias 26c to the optoelectronic light emission device 15. A second line 27d may then be formed to provide electrical communication between the vias 26d to the second semiconductor device 40 and the vias 26d to the optoelectronic light detection device 35.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. An electrical device comprising:
a first semiconductor device positioned on a first portion of a type IV semiconductor substrate;
an optoelectronic light emission device comprising type III-V semiconductor materials that is in electrical communication with the first semiconductor device, wherein the optoelectronic light emission device is positioned adjacent to the first semiconductor device on the first portion of the type IV semiconductor substrate;
a dielectric waveguide present on a second portion of the type IV semiconductor substrate; and
an optoelectronic light detection device comprising type III-V semiconductor material present on a third portion of the type IV semiconductor device, wherein the dielectric waveguide is positioned between and aligned with the optoelectronic light detection device and optoelectronic light emission device to transmit a light signal from the optoelectronic light emission device to the optoelectronic light detection device.

2. The electronic device of claim 1, wherein the first semiconductor device comprises a switching device selected from the group consisting of field effect transistor (FET), fin field effect transistor (FinFET), metal oxide semiconductor field effect transistor (MOSFET), bipolar junction transistor (BJT), Schottky barrier semiconductor device, junction field effect transistor (JFET) and combinations thereof, or the semiconductor device comprises a memory device selected from the group consisting of flash memory, dynamic random access memory, embedded dynamic random access memory, and combinations thereof.

3. The electronic device of claim 1, wherein the optoelectronic light emission device is a quantum well laser comprising a first conductivity type III-V semiconductor material layer, a quantum well stack of III-V semiconductor material layers that is present on the first conductivity type III-V semiconductor material layer, and a second conductivity type III-V semiconductor material layer that is present on the quantum well stack of III-V semiconductor material layers.

4. The electronic device of claim 1, wherein the optoelectronic light detection device includes a first conductivity type III-V semiconductor material layer, an intrinsic III-V semiconductor material layer, and a second conductivity type III-V semiconductor material layer.

5. The electronic device of claim 1, wherein a first region of a first portion of the type IV semiconductor substrate that the first semiconductor device is positioned on includes an SOI layer, a buried dielectric layer, and a base semiconductor substrate, in which the first semiconductor device is positioned directly on the SOI layer.

6. The electronic device of claim 5, wherein a second region of the first portion of the type IV semiconductor substrate only includes the base semiconductor substrate, and the optoelectronic light emission device is present directly on a first buffer layer, wherein the first buffer layer is directly on the base semiconductor substrate.

7. The electronic device of claim 6, wherein the first buffer layer has a lattice dimension between a lattice dimension for the base semiconductor substrate and a first conductivity type III-V semiconductor material layer of the optoelectronic light emission device, the base semiconductor substrate having a composition selected from the group consisting of SiGe, Ge, GaAs, GaAsP and combinations thereof.

8. The electrical device of claim 1, wherein the optoelectronic light detection device is in electrical communication with a second semiconductor device, wherein the second semiconductor device comprises a switching device selected from the group consisting of field effect transistor (FET), fin field effect transistor (FinFET), metal oxide semiconductor field effect transistor (MOSFET), bipolar junction transistor (BJT), Schottky barrier semiconductor device, junction field effect transistor (JFET), and combinations thereof, or the second semiconductor device comprises a memory device selected from the group consisting of flash memory, dynamic random access memory, embedded dynamic random access memory, and combinations thereof.

9. The electrical device of claim 8, wherein the dielectric waveguide has a width that tapers from a first face having a first width that is adjacent to the optoelectronic light emission device to a second face having a second width that is adjacent to the optoelectronic light detection device.

10. The electrical device of claim 9, wherein the dielectric waveguide is comprised of a dielectric material selected from the group consisting of amorphous silicon, polysilicon, poly III-V semiconductor material, aluminum nitride (AlN) and a combination thereof.

11. The electrical device of claim 9, wherein the second portion of the type IV semiconductor substrate includes the buried dielectric layer, and the base semiconductor substrate, wherein a base of the dielectric waveguide is separated from the buried dielectric layer by at least one layer of an isolation dielectric material.

12. The electric device of claim 1, wherein the third portion of the type IV semiconductor substrate only includes the base semiconductor substrate, and the optoelectronic light detection device is present directly on a second buffer layer, wherein the second buffer layer is directly on the base semiconductor substrate.

13. The electrical device of claim 12, wherein the first buffer layer has a lattice dimension between a lattice dimension for the base semiconductor substrate and a first conductivity type III-V semiconductor material layer of the optoelectronic light emission device, the base semiconductor substrate having a composition selected from the group consisting of SiGe, Ge, GaAs, GaAsP and combinations thereof.

14. An electrical device comprising:
a first conductivity semiconductor device positioned on a first portion of a type IV semiconductor substrate;
optoelectronic light emission device comprising type III-V semiconductor materials that is in electrical communication with the first semiconductor device, wherein the optoelectronic light emission device is positioned adjacent to the first conductivity semiconductor device on the first portion of the type IV semiconductor substrate;
a dielectric waveguide present on a second portion of the type IV semiconductor substrate;
an optoelectronic light detection device comprising type III-V semiconductor material present on a third portion of the type IV semiconductor substrate, wherein the dielectric waveguide is positioned between and aligned with the optoelectronic light detection device and optoelectronic light emission device to transmit a light signal from the optoelectronic light emission device to the optoelectronic light detection device; and
a second conductivity semiconductor device positioned on the third portion of the type IV semiconductor substrate, wherein the second conductivity semiconductor device is in electrical communication with the optoelectronic light detection device.

15. The electrical device of claim 14, wherein the first semiconductor device comprises a first switching device selected from the group consisting of field effect transistor (FET), fin field effect transistor (FinFET), metal oxide semiconductor field effect transistor (MOSFET), bipolar junction transistor (BJT), Schottky barrier semiconductor device, junction field effect transistor (JFET), and combinations thereof, or the first semiconductor device comprises a first memory device selected from the group consisting of flash memory, dynamic random access memory, embedded dynamic random access memory, and combinations thereof, and the second semiconductor device comprises a second switching device selected from the group consisting of field effect transistor (FET), fin field effect transistor (FinFET), metal oxide semiconductor field effect transistor (MOSFET), bipolar junction transistor (BJT), Schottky barrier semiconductor device, junction field effect transistor (JFET), and combinations thereof, or the second semiconductor device comprises a second memory device selected from the group consisting of flash memory, dynamic random access memory, embedded dynamic random access memory, and combinations thereof.

16. The electrical device of claim 14, wherein the optoelectronic light emission device is a quantum well laser comprising a first conductivity type III-V semiconductor material layer, a quantum well stack of III-V semiconductor material layers that is present on the first conductivity type III-V semiconductor material layer, and a second conductivity type III-V semiconductor material layer that is present on the quantum well stack of III-V semiconductor material layers.

17. The electrical device of claim 14, wherein the optoelectronic light detector device comprises a first conductivity type III-V semiconductor layer, an intrinsic III-V semiconductor material layer, and a second conductivity type III-V semiconductor material layer.

18. The electrical device of claim 14, wherein there is no continuous physical electrical communication structures between the first semiconductor device and the second semiconductor device.

19. A method of forming an electrical device comprising:
forming a first semiconductor device on a first portion of an SOI substrate and forming a second semiconductor device on a third portion of the SOI substrate, the SOI substrate including an SOI layer present on a buried dielectric layer, the buried dielectric layer being present on a base semiconductor substrate;
removing a portion of the SOI layer and the buried dielectric layer of the SOI substrate to expose portions of the base semiconductor substrate adjacent to each of the first semiconductor device and the second semiconductor device, wherein an island of remaining portions of at least the buried dielectric layer is present between the exposed portions of the base semiconductor layer in a second portion of the SOI substrate;
forming an optoelectronic light emission device comprising type III-V semiconductor materials on the exposed portion of the base semiconductor layer adjacent to the first semiconductor device;
forming an optoelectronic light detection device comprising type III-V semiconductor material on the exposed portion of the base semiconductor layer adjacent to the second semiconductor device; and
forming a dielectric waveguide on the island in the second portion of the SOI substrate.

20. The method of claim 19, wherein the optoelectronic light emission device is a quantum well laser comprising a first conductivity type III-V semiconductor material layer, a quantum well stack of III-V semiconductor material layers, and a second conductivity type III-V semiconductor material layer, and the optoelectronic light emission detector including a first conductivity type III-V semiconductor material layer, an intrinsic III-V semiconductor material layer, and a second conductivity III-V semiconductor material layer.

* * * * *